(12) United States Patent
Yoshinaka

(10) Patent No.: US 6,378,107 B1
(45) Date of Patent: Apr. 23, 2002

(54) DIGITAL SIGNAL REPRODUCING APPARATUS

(75) Inventor: Tadaaki Yoshinaka, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 09/339,748

(22) Filed: Jun. 24, 1999

Related U.S. Application Data

(63) Continuation of application No. PCT/JP98/04813, filed on Oct. 23, 1998.

(30) Foreign Application Priority Data

Oct. 24, 1997 (JP) ............................................. 9-292299

(51) Int. Cl.⁷ ......................... G11B 5/035; G11B 20/18; H03M 13/41
(52) U.S. Cl. ............................ 714/795; 360/53; 360/65
(58) Field of Search ............................ 714/795; 360/65, 360/53

(56) References Cited

U.S. PATENT DOCUMENTS

| | | | |
|---|---|---|---|
| 4,870,414 A | * 9/1989 | Karabed et al. ............... 341/57 |
| 5,089,917 A | * 2/1992 | Kanota et al. ................ 360/45 |
| 5,533,031 A | * 7/1996 | Dounn et al. .............. 371/21.1 |
| 5,619,539 A | * 4/1997 | Coker et al. ................. 375/341 |
| 5,675,569 A | * 10/1997 | Yamaguchi et al. ........ 369/124 |
| 5,729,517 A | * 3/1998 | Fujiwara et al. .............. 369/59 |
| 5,802,505 A | * 9/1998 | Maruno et al. ................ 706/16 |
| 5,822,143 A | * 10/1998 | Cloke et al. ................... 360/65 |

FOREIGN PATENT DOCUMENTS

JP  9-130273  5/1997  .......... H03M/13/12

OTHER PUBLICATIONS

Marukawa et al., "Feedforward Noise Canceller for PR1ML", IEEE Trans. on Magnetics, vol. 33, No. 5, Sep. 1997, pp. 2800–2802.*

* cited by examiner

Primary Examiner—Stephen M. Baker
(74) Attorney, Agent, or Firm—Bell, Boyd & Lloyd LLC

(57) ABSTRACT

This invention relates to a digital signal reproducing apparatus. This invention is applicable to an apparatus such as a video tape recorder and an optical disk drive, using a Viterbi decoder therein. Noise characteristics are equalized at points of discrimination by adding an equalized signal SPR4 of a differential system and an equalized signal SPR1 of an integrating system in a weighted manner, or by adding up metrics Maa–Mbb, (Ma', Mb') relative to amplitude reference values calculated for the two equalized signals SPR4 and SPR1, over each of relevant paths in a weighted fashion. The arrangements allow the inventive apparatus to avert noise-induced deterioration of discrimination accuracy.

10 Claims, 20 Drawing Sheets

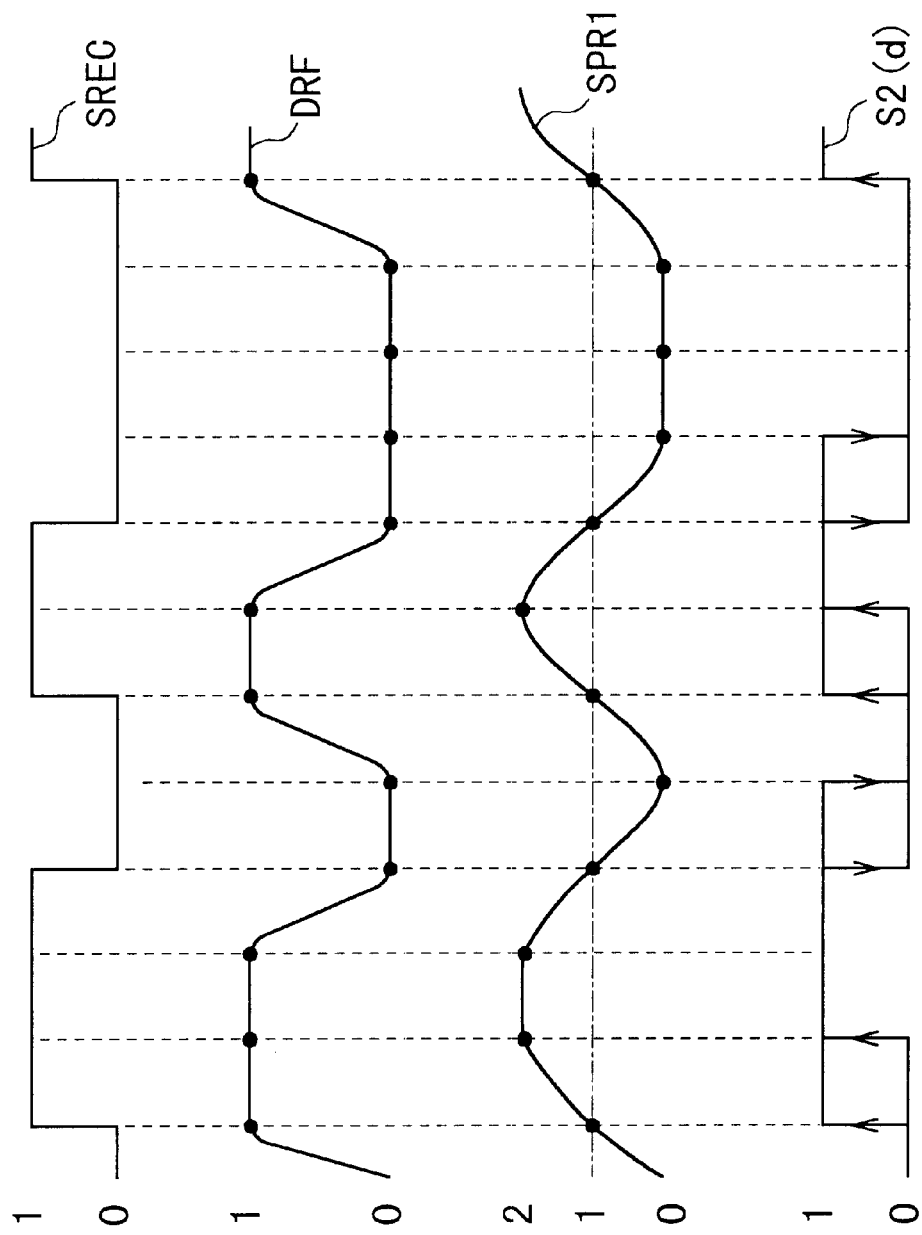

FIG. 11

| PREVIOUS INPUT | | | STATE | INPUT | EPR4 OUTPUT | PR1 OUTPUT | SXPR4 OUTPUT | NEXT STATE |
|---|---|---|---|---|---|---|---|---|
| a[k-3] | a[k-2] | a[k-1] | b[k-1] | a[k] | c[k] | c'[k] | d[k] | b[k] |
| 0 | 0 | 0 | S000 | 0 | 0 | -q | -q | S000 |
| 0 | 0 | 0 | S000 | 1 | 1 | q | 1 | S001 |
| 0 | 0 | 1 | S001 | | | | | |
| 0 | 1 | 1 | S001 | 1 | 2 | q | 2+q | S011 |
| 0 | 1 | 1 | S011 | 0 | 0 | 0 | 0 | S110 |
| 0 | 1 | 1 | S011 | 1 | 1 | q | 1+q | S111 |
| 1 | 0 | 0 | S100 | 0 | -1 | -q | -1-q | S000 |
| 1 | 0 | 0 | S100 | 1 | 0 | 0 | 0 | S001 |
| 1 | 1 | 0 | S110 | 0 | -2 | -q | -2-q | S100 |
| 1 | 1 | 0 | S110 | | | | | |
| 1 | 1 | 1 | S111 | 0 | -1 | 0 | -1 | S110 |
| 1 | 1 | 1 | S111 | 1 | 0 | q | q | S111 |

FIG. 18

| PREVIOUS INPUT | | | STATE | INPUT | OUTPUT | NEXT STATE |
|---|---|---|---|---|---|---|
| a[k-3] | a[k-2] | a[k-1] | b[k-1] | a[k] | c[k] | b[k] |
| 0 | 0 | 0 | S000 | 0 | 0 | S000 |
| 0 | 0 | 0 | S000 | 1 | 1 | S001 |
| 0 | 0 | 1 | S001 | | | |
| 0 | 0 | 1 | S001 | 1 | 2 | S011 |
| 0 | 1 | 1 | S011 | 0 | 0 | S110 |
| 0 | 1 | 1 | S011 | 1 | 1 | S111 |
| 1 | 0 | 0 | S100 | 0 | -1 | S000 |
| 1 | 0 | 0 | S100 | 1 | 0 | S001 |
| 1 | 1 | 0 | S110 | 0 | -2 | S100 |
| 1 | 1 | 0 | S110 | | | |
| 1 | 1 | 1 | S111 | 0 | -1 | S110 |
| 1 | 1 | 1 | S111 | 1 | 0 | S111 |

DIGITAL SIGNAL REPRODUCING APPARATUS

This application is a continuation of international application No. PCT JP/98/04813, filed Oct. 23, 1998, now pending.

TECHNICAL FIELD

The present invention relates to a digital signal reproducing apparatus being adaptable to a use of Viterbi decoding such as video tape recorders and optical disk drives. More particularly, the invention relates to a digital signal reproducing apparatus wherein equalizing references of a differential system and an integrating system are added in a predetermined ratio for decisions of maximum likelihood, or the distances (i.e., branch metrics) from respective amplitude reference values based on the equalizing references of the differential system and an integrating system are added in a predetermined ratio for a binary discrimination, thereby to improve the discriminating accuracy degraded by noise.

BACKGROUND ART

In Video tape recorders, optical disk drives or like, a digital signal recorded at a high density is conventionally intended to ensure reliable the reproduction thereof by processing the reproduced signal with Viterbi decoding.

In other words, Viterbi decoding defines "n" states determined by intersymbolic interference, through the use of combinations of the instant preceding input data. Every time the input data are changed, the current "n" states are replaced with the ensuing "n" states to process the changed input data. Specifically, when the intersymbolic interference has a length of "m", the "n" states are determinedby the preceding (m-1) bits. For example, when the input signal is a digital signal of "1" and "0", there exists a total of $n=2^{(m-1)}$ states.

It is assumed with reference to the "n" states defined above that the level of noise contained in the reproduced signal has a Gaussian distribution and that the value of the reproduced signals corresponding to each noise-free state is regarded as an amplitude reference value. In that case, the likelihood of a transition to each of the "n" states is represented by a value obtained by squaring the difference between an amplitude reference value and an actually reproduced signal and by accumulating the squared values until one of the states is reached. According to the Viterbi decoding, the likelihood values are accumulated for each of possible paths leading from the preceding "n" states to each of the current states. Given the result of the calculations, it is judged that a transition has taken place over the path having the strongest likelihood (i.e., with the smallest accumulated value). With the judgment made, the current "n" states are replaced by the ensuing "n" states, and the hysteresis and likelihood of a discriminated value in each state are updated.

The transitions of maximum likelihood states are detected successively up to a stage where hysteretic records going back several bits in time are merged into a single item of hysteresis. This finalizes the result of signal discrimination so far. As outlined, Viterbi decoding discriminates the reproduced signal by making the most of the signal power of the reproduced signal where the noise superimposed on the reproduced signal is random noise. The Viterbi decoding provides an appreciable improvement of the error rate over the conventional decoding method by which the reproduced signal is compared with a predetermined threshold value for each bit.

Such Viterbi decoding is commonly used to process signals equalized in partial response. Depending on the characteristics of a transmission system in use, either the equalized characteristic of an integrating system such as PR (1, 1; referred to as PR1 hereinafter) or the equalized characteristic of a differential system such as EPR (Extended Partial Response; 1, 1, -1, -1; referred to as EPR4 hereinafter) is adapted to partial response equalization.

FIG. 18 is a table showing state transitions of a combination of RLL (Run Length Limited; 1, 7) code with EPR4 equalization. The RLL (1, 7) code is a coding method whereby at least two logical 1s or 0s always occur continuously (a single logical 1 or 0 will not occur under the coding scheme based on what is known as d=1 restriction). EPR4 entails intersymbolic interference in subsequent three bits for each input data item because of PR (1, 1, -1, -1).

In the above combination, the hysteresis of input data of up to three earlier bits determines uniquely the state transition (output) of the subsequently input data. In FIG. 18, a[k] denotes input data, and a[k-1], a[k-2] and a[k-3] stand for input data which are one, two and three clock pulses previous to the input data a[k] respectively. A state b[k-1] resulting from the input data a[k-1], a[k-2] and a[k-3] is represented by a symbol S together with respective values of the input data a[k-1], a[k-2] and a[k-3]. For example, when the input a[k] has a value of 0 in a state (S000), then an output c[k] with a value of 0 is obtained, and a state b[k] is changed to (S000).

According to the RLL (1, 7) code, the states (S010) and (S101) do not occur under the d=1 restriction. With the two states (S010) and (S101) excluded, each state b[k-1] is changed to two states corresponding to the 0 or 1 input, whereby six states are taken as a whole. In the case of the RLL (1, 7) code, the output signal c[k] has five amplitude reference values: -2, -1, 0, 1 and 2. These relations are illustrated in a trellis diagram of FIG. 19.

As shown in the trellis diagram of FIG. 19 formed by repetitive patterns, the Viterbi decoding method decodes the input signal by accumulating squared values of the difference between an EPR4 equalized reproduced signal and an EPR4 equalized amplitude reference value (the difference is made of distances, i.e., branch metrics) and by selecting the path having the smallest accumulated value (metric).

With regard to the equalized characteristic of an integrating system such as PR1, a low frequency region tends to be emphasized excessively as shown in FIG. 20. When the equalized characteristic of such an integrating system is applied to a magnetic recording and reproducing system having difficulty in reproducing DC components, the low frequency region of the latter system is likely to be inordinately emphasized. This results in a deterioration of the accuracy of signal discrimination due to low frequency noise such as cross talk.

With respect to the equalized characteristic of a differential system such as EPR4, the low frequency region is suppressed while a high frequency region with an inferior S/N ratio tends to be emphasized, as illustrated in FIG. 21. when the equalized characteristic of such a differential system is applied to a magnetic recording and reproducing system for high-density (short waveform) recording, the presence of high frequency noise can make it difficult to ensure sufficient accuracy of signal discrimination.

It is appreciated that recording density, for example will be further enhanced when such noise-degraded levels of accuracy in signal discrimination are improved.

Therefore, the present invention is invented to overcome the above deficiencies and disadvantages of the prior art and it is the object thereof to provide a digital signal reproducing apparatus capable of improving noise-degraded levels of accuracy in signal discrimination.

DISCLOSURE OF INVENTION

According to the present invention, there is provided a digital signal reproducing apparatus wherein equalized signals of a differential system and an integrating system are added in a weighted manner to obtain an added equalized signal which is subjected to maximum likelihood decoding, whereby a result of binary discrimination corresponding to an input signal is outputted.

Metrics of the differential system and the integrating system are added using a predetermined weighting factor every transitions corresponding thereto. Then, the calculated metrics are accumulated to obtain likelihood values for each of transition paths. Next, the strongest likelihood is judged from the obtained values, and a discriminated binary value is outputted corresponding to the input signal.

When the transition of the integrating system reaches a predetermined equalizing reference value during the weighted adding process above, additions are made selectively for the transitions of the equalizing reference value in question.

In the above cases, the weighting factor is modified in accordance with detected result of the level fluctuations of the input signal.

The equalized signals of the differential system and the integrating system are added up in a weighted fashion to generate an added equalized signal so that, by equalizing frequency characteristics of noise components, this process may generate an added equalized signal which, with its noise characteristics close to those of the white noise, is best fit for Viterbi decoding. When the added equalized signal is subjected to maximum likelihood decoding in order to output a discriminated binary value corresponding to the input signal, the noise-induced degradation of signal discrimination accuracy can be effectively prevented.

The metrics of the integrating system and the differential system are added using a predetermined weighting factor every transition corresponding thereto, and then the added metrics are accumulated to obtain the likelihood of each transition. This provides likelihood levels in the same manner as in the case where frequency characteristics of noise components are equalized so as to generate an added equalized signal that, with its noise characteristics close to those of the white noise, is best fit for Viterbi decoding. As a result, binary discriminated values are outputted in such a way that effectively averts noise-induced degradation of accuracy in signal discrimination.

When the transition of the integrating system reaches a predetermined equalizing reference value during the weighted adding process, additions may be made selectively for the transitions of the equalizing reference value in question. In such a case, the selective additions may be illustratively timed so that the equalizing reference value is set to zero. This makes it possible to avoid lowering discriminatory levels for the input signal caused by the latter's amplitude fluctuations.

In any of the above cases, the weighting factors are varied in accordance with the detected result of the level fluctuations of the input signal. This permits effective removal of those frequency characteristic fluctuations in noise components, which accompany amplitude fluctuations of the input signal. Thereby, eliminating the frequency characteristic fluctuations in turn may avert degradation of signal discrimination accuracy caused by the amplitude fluctuations.

BRIEF DESCRIPTION OF DRAWINGS

FIGS. 3A through 3D are a signal waveform chart for explaining provisional discrimination by the Viterbi decoder of FIG. 1;

FIG. 11 is a table showing state transitions of equalized signals relevant to the Viterbi decoder of FIG. 10;

FIG. 18 is a table showing state transitions of a PRE4 equalized signal;

BEST MODE FOR CARRYING OUT THE INVENTION

Figure 1:
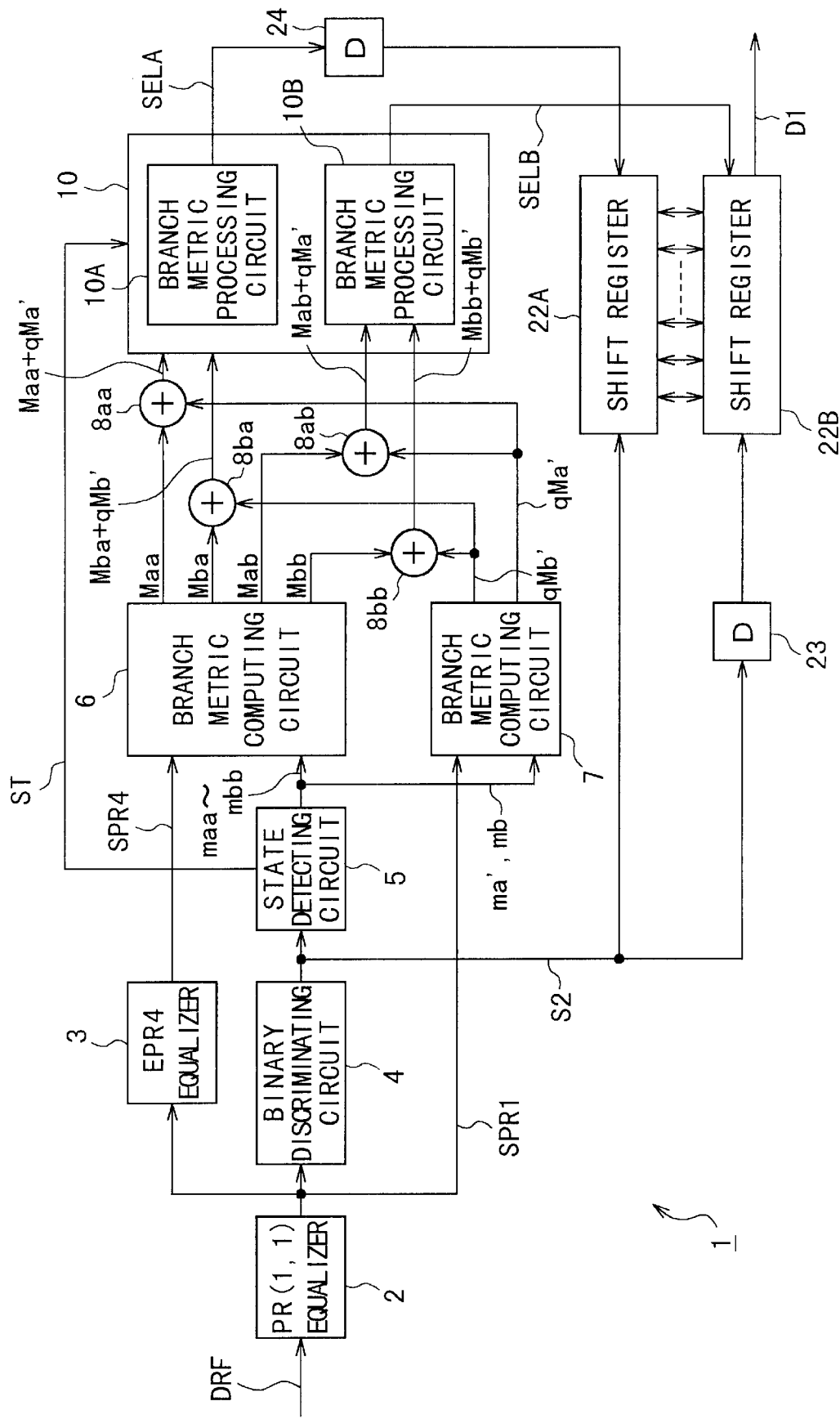
FIG. 1 is a block diagram of a Viterbi decoder of a first embodiment of this invention.

Embodiments for carrying out the invention will now be described with reference to the accompanying drawings.
(1) First Embodiment
(1-1) Constitution of the First Embodiment FIG. 1 is a block diagram showing a Viterbi decoder of the embodiment of this invention. The Viterbi decoder 1 reproduces a digital signal coded in RLL (1, 7) code when it is applied to a video tape recorder. The reproduced signal from a magnetic head of the recorder is subject to Nyquist equalization by a waveform equalizing circuit, not shown. The equalized signal is converted by an analog-digital converting process to a digital reproduced signal DRF and the converted signal is inputted into the Viterbi decoder 1.

In the Viterbi decoder 1, a PR (1, 1) equalizer 2 equalizes the digital reproduced signal DRF with respect to a PR1 equalizing reference for an integrating system, thus generating a PR1 equalized signal SPR1. The PR (1, 1) equalizer 2 comprises a delay circuit and an adder. The delay circuit delays by one clock cycle each of the successively inputted digital reproduced signals DRF. The adder adds the input and output of the delay circuit and outputs the sum. Using these components, the PR (1, 1) equalizer 2 carries out (1+D) operations to generate a PR1 equalized signal SPR1.

Upon receipt of the PR1 equalized signal SPR1, an EPR4 equalizer 3 delays each sampled value successively by two clock cycles. The delayed input data and the successively input data are subject to subtraction and the difference is outputted. The EPR4 equalizer 3 then operates on the PR1 equalized signal SPR1 using an operation expression $1-D^2$. The result is equalized with respect to an EPR4 equalizing reference for a differential system, whereby an EPR4 equalized signal SPR4 is outputted.

In the manner described, the Viterbi decoder 1 generates the PR1 equalized signal SPR1 and EPR4 equalized signal SPR4 shown in FIGS. 2A through 2D with operation process using the following expressions:

$$SPR1 = pr1(i) \qquad (1)$$
$$= nq(1) + nq(i-1);$$

$$SPR4 = epr4(i) \qquad (2)$$
$$= pr1(i) - pr1(i-2)$$

where nq(i) denotes a Nyquist equalized signal.

Figures 2A, 2B, 2C, 2D:
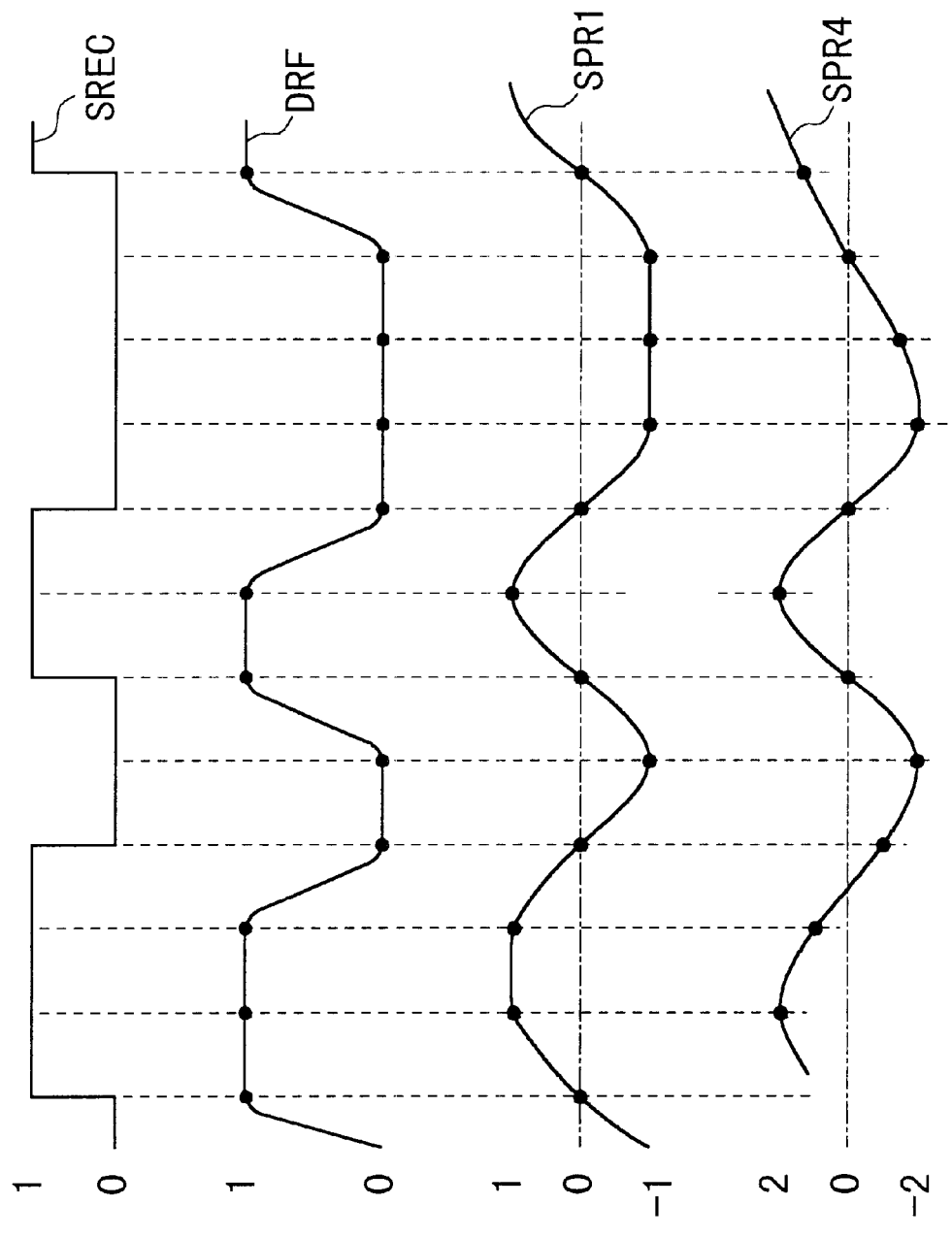
FIGS. 2A through 2D are a signal waveform chart showing equalized signals relevant to the Viterbi decoder of FIG. 1.

In FIGS. 2A through 2D, respective waveforms of a recorded signal SREC, a digital reproduced signal DRF, a corresponding PR1 equalized signal SPR1 and a corresponding EPR4 equalized signal SPR4 are shown (FIG. 2A shows a waveform of the recorded signal SREC with amplitude reference values of 1 and 0; FIG. 2B depicts a waveform of the digital reproduced signal DRF obtained by subjecting the recorded signal SREC to Nyquist equalization; FIG. 2C illustrates a waveform of the corresponding PR1 equalized signal SPR1; and FIG. 2D indicates a waveform of the corresponding EPR4 equalized signal SPR4). For purpose of simplification and illustration, the amplitude reference values for the PR1 equalized signal SPR1 are shown being reduced by a value of 1.

A binary discriminating circuit 4 converts the PR1 equalized signal SPR1 into binary format with respect to the amplitude reference value of 1 and outputs the converted signal. More specifically, as shown in FIGS. 3A through 3C, the recorded signal SREC (see FIG. 3A) made of the amplitude reference values of 1 and 0, is subjected to Nyquist equalization (see FIG. 3B). Then, the equalized signal is converted to the PR1 equalized signal SPR1 (see FIG. 3C) The PR1 equalized signal SPR1 thus acquired is a signal based on amplitude reference values of 0, 1 and 2.

Because the PR1 equalized signal SPR1 is processed in RLL (1, 7) code, the signal SPR1 has the corresponding amplitude reference values set for 0 and 2 before and after the amplitude reference value 1 is crossed. Thus when the PR1 equalized signal SPR1 is converted to binary form with respect to the amplitude reference value of 1, a margin of discrimination $2^{1/2}$ times that in effect when the digital reproduced signal DRF derived from simple Nyquist equalization is turned to binary form may be obtained in the amplitude direction.

In that case, the binary discriminating circuit 4 generates a discriminated binary signal S2 (d) by discriminating on a binary basis the reproduced signal DRF containing equalization-induced noise in accordance with the following conditions:

$d=1$ if $Z(k) \geq 1$ $d=0$ if $Z(k) < 1$ \qquad (3)

where Z(k) represents the reproduced signal.

The discriminated result S2(d), (as shown in FIG. 3D), is a signal in which respective edges are in phase with or delayed by one clock pulse relative to the recorded signal SREC. That is because the times at which the amplitude reference value of 1 is crossed are shifted by noise. Hence the discriminated result S2 (d) has such an error that a one-clock error occurs at each edge because discrimination has been achieved with margins $2^{1/2}$ times as large in the amplitude direction and twice as large in the phase direction, as compared with a case where the digital reproduced signal DRF derived from simple Nyquist equalization is put into binary form. However, in the discriminated result S2(d), the recorded signal SREC is correctly discriminated except for the above one-clock error. Thus, in this embodiment, the binary discriminating circuit 4 provisionally discriminates the reproduced signal RF. The result of such provisional discrimination is used to reduce quantities of calculations.

Figures 4A, 4B, 4C, 4D:
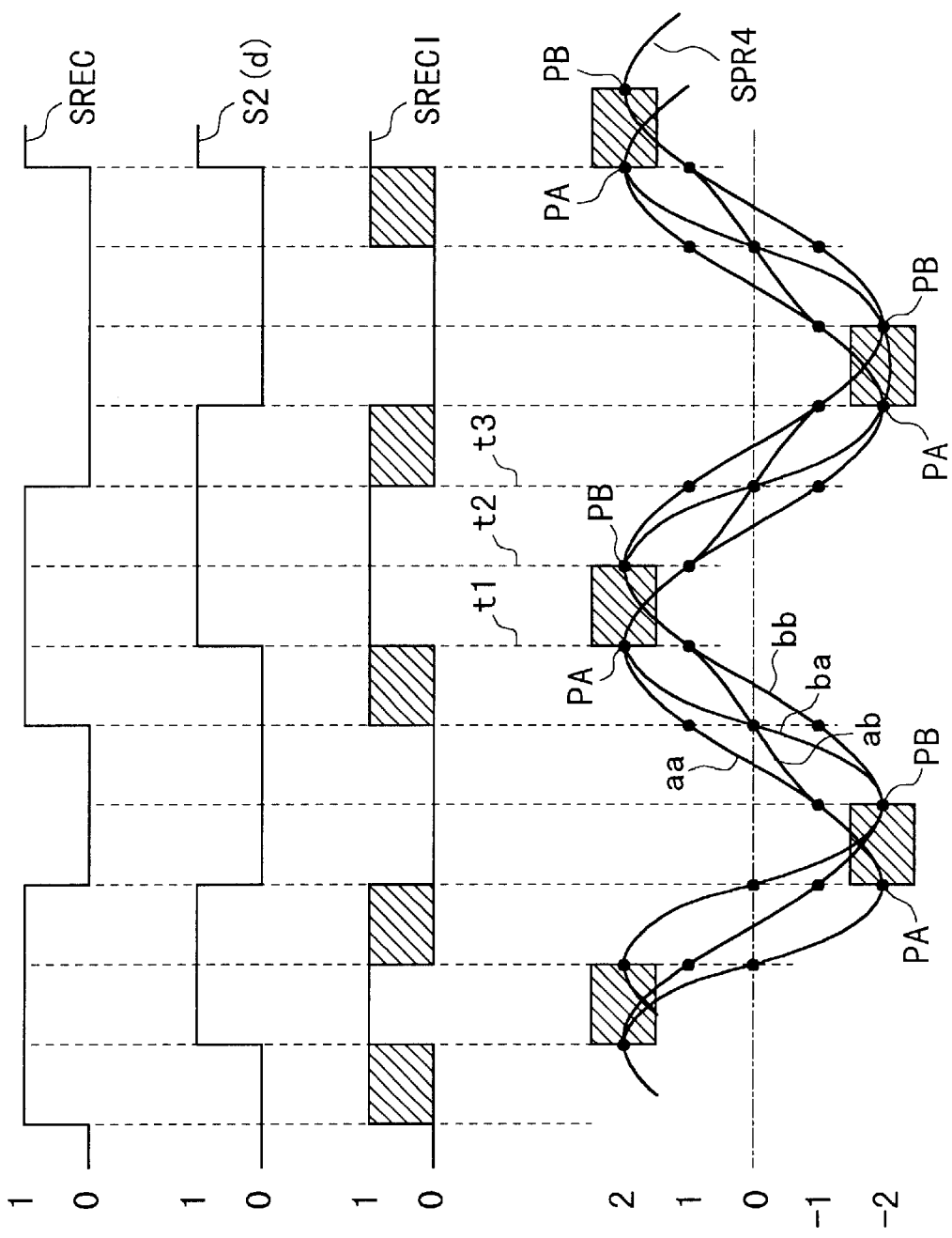
FIGS. 4A through 4D are a signal waveform chart depicting relations between the provisional discrimination shown in FIGS. 3A through 3D on the one hand and an EPR4 equalized signal on the other hand.

Relation between the recorded signal SREC (see FIG. 4A) and the provisionally discriminated result S2 (see FIG. 4B) is shown in FIGS. 4A through 4D. As illustrated, each edge in the provisionally discriminated result S2 (d) is timed so as to be either delayed by one clock pulse relative to the recorded signal SREC (called trailing edge timing hereinafter), or to be correctly in synchronism with the latter signal (called leading edge timing hereinafter). It follows that a recorded signal SRECI derived conceivably from the provisionally discriminated result S2(d) takes a signal waveform whose edge timings are unpredictable, as shown in FIG. 4C.

Supposing that the leading edge timing is correct, then its corresponding state of the EPR4 equalized signal SPR4 (FIG. 4D) is either S001 or S110 as indicated in FIG. 18. The output is made of values 0 and 1, or of values 0 and −1. In either case, the two paths converge, generating an output value of 2 or −2 at the subsequent sampling point (trailing edge timing).

Likewise, supposing that the trailing edge timing is correct, then its corresponding state of the EPR4 equalized signal SPR4 is S001 or S110. The two paths converge, also generating the output value of 2 or −2 at the ensuing sampling point.

Figure 19:
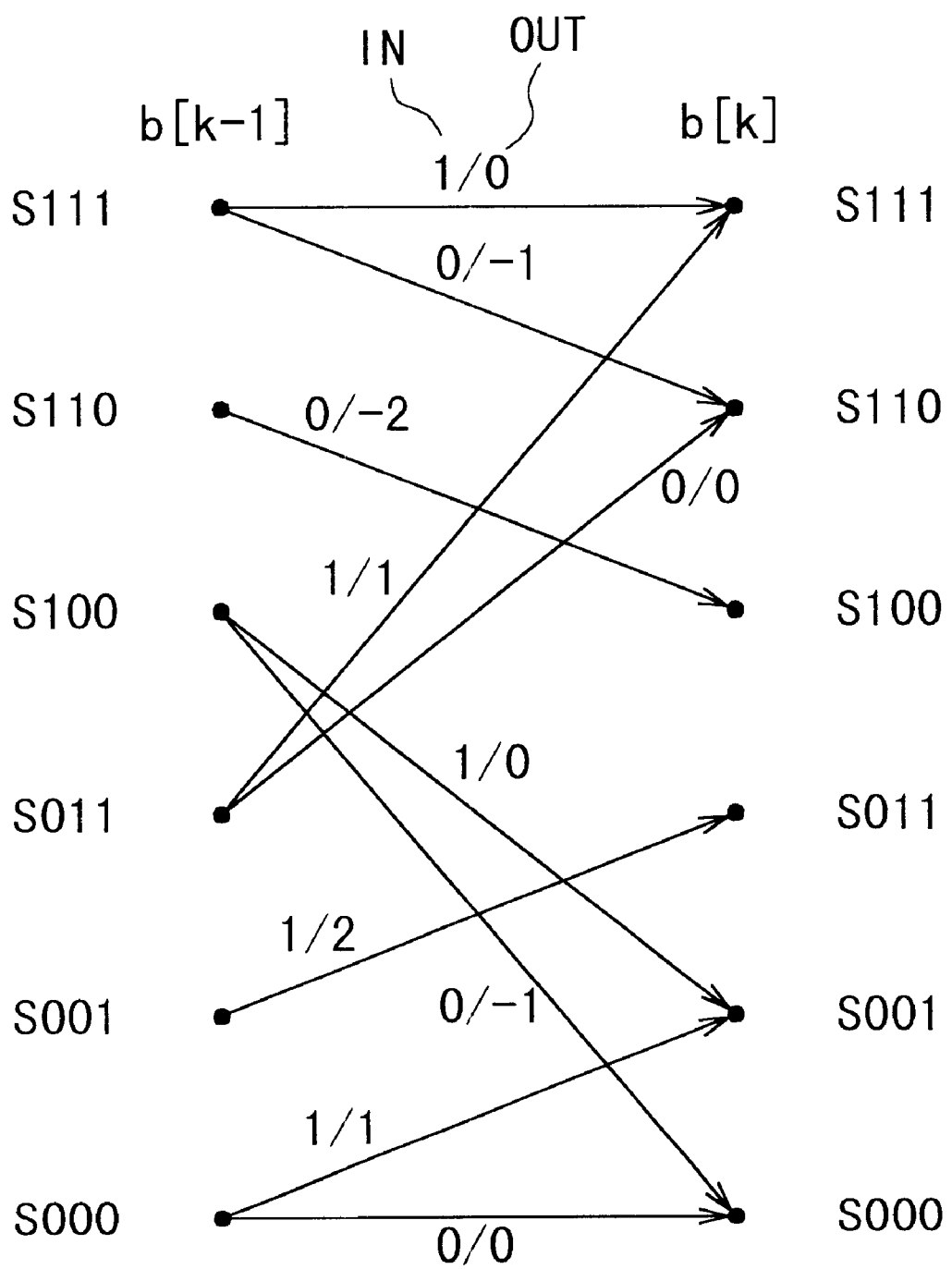
FIG. 19 is a trellis diagram derived from the table of FIG. 18.
Figure 20:
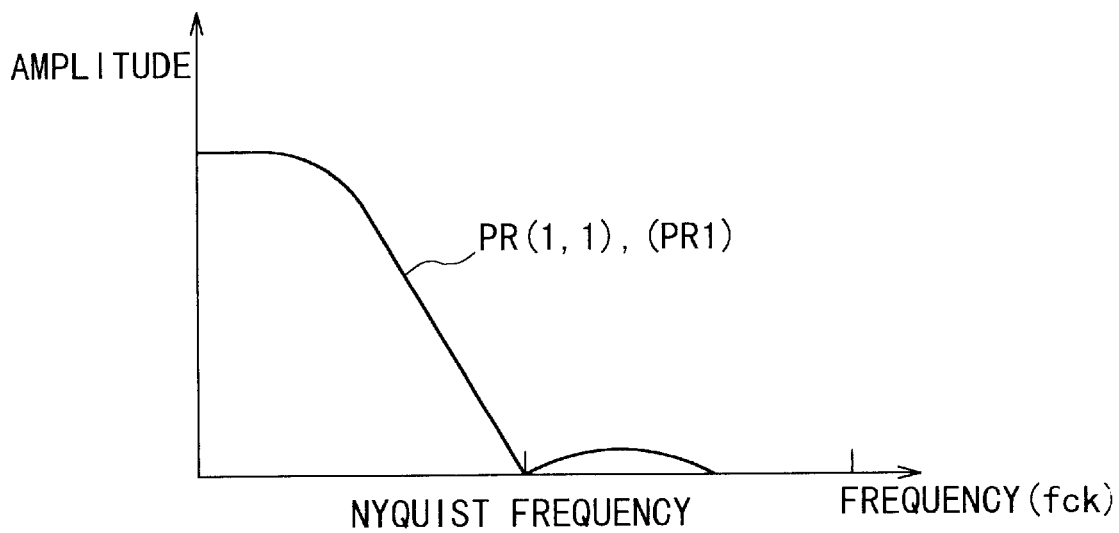
FIG. 20 is a graphic representation illustrating a frequency characteristic of an equalized signal for an integrating system.
Figure 21:
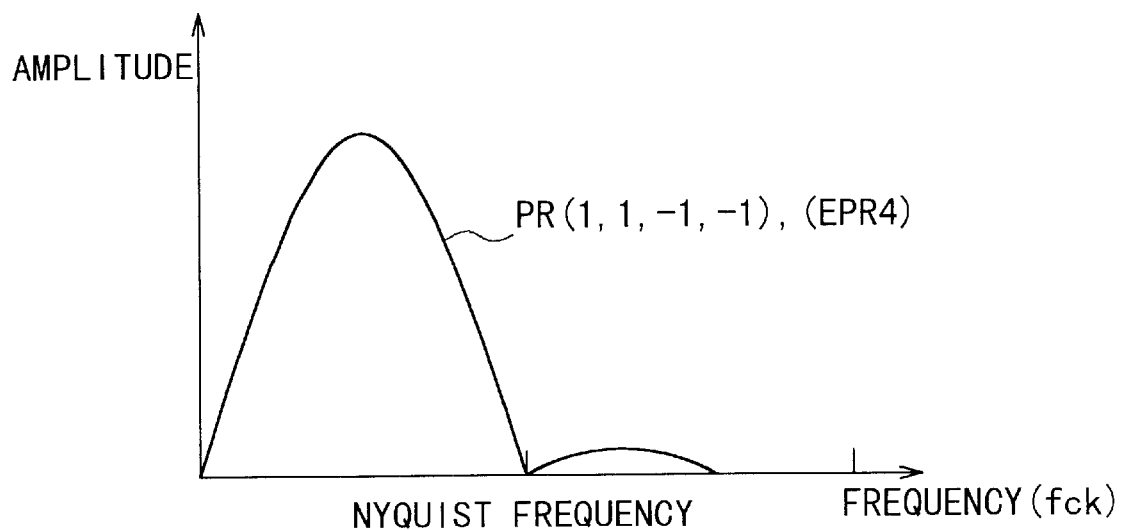
FIG. 21 is a graphic representation depicting a frequency characteristic of an equalized signal for a differential system.

Metrics are then computed on paths "aa" through "bb" connecting an amplitude reference value PA relating to the value of 2 or −2 corresponding to each leading edge, to an amplitude reference value PB relating to the value of 2 or −2 corresponding to each trailing edge. The computed values are used as a basis for judging the likelihood of the discriminated result at the edges. This makes it possible to select the path of maximum likelihood without calculating metrics on all state transitions as is the case with the conventional Viterbi decoding method. That is, a device constitution more simplified as a whole than before is sufficient to provide correctly decoded results. With this embodiment, the processing of six states shown in FIG. 19 is replaced by the processing of four states.

Under the d=1 restriction, the sampling point subsequent to a point of path convergence is known to have no convergence. Thus after judgment of the metric for the segment in question, the ensuing metric calculation in addition to the branch metric may be carried out at intervals of two sampling cycles as needed. This makes it possible simply to process rapidly transferred input data.

Specifically, when either values 0 and 0, or values 1 and 1 continue in the RLL (1, 7) code (i.e., where the discriminated result is 2T), there exist three paths between the amplitude reference values 2 and −2. When value 0 or 1 continues for three bits or more, there are four paths between the amplitude reference values 2 and −2. In that case, Viterbi decoding is implemented by computing metrics on four paths when the paths are judged with reference to the provisionally discriminated edge timings.

In the following description, "aa" denotes a path leading from the amplitude reference value corresponding to one leading edge, to the amplitude reference value corresponding to a leading edge; "ab" represents a path from the amplitude reference value corresponding to a leading edge, to the amplitude reference value corresponding to a trailing edge; "ba" stands for a path from the amplitude reference value corresponding to a trailing edge, to the amplitude reference value corresponding a leading edge; and "bb" indicates a path from the amplitude reference value corresponding to a trailing edge, to the amplitude reference value corresponding a trailing edge. In other words, the path "aa" applies if a variable point of the provisionally discriminated signal S2 is made correct when advanced by one clock pulse; the path "ab" applies if a leading-edge variable point of the provisionally discriminated signal S2 is made correct when advanced by one clock pulse; the path "ba" applies if a trailing-edge variable point of the provisionally discriminated signal S2 is made correct when advanced by one clock pulse; and the path "bb" applies if the variable point of the provisionally discriminated signal S2 is correct.

Figures 5A, 5B:
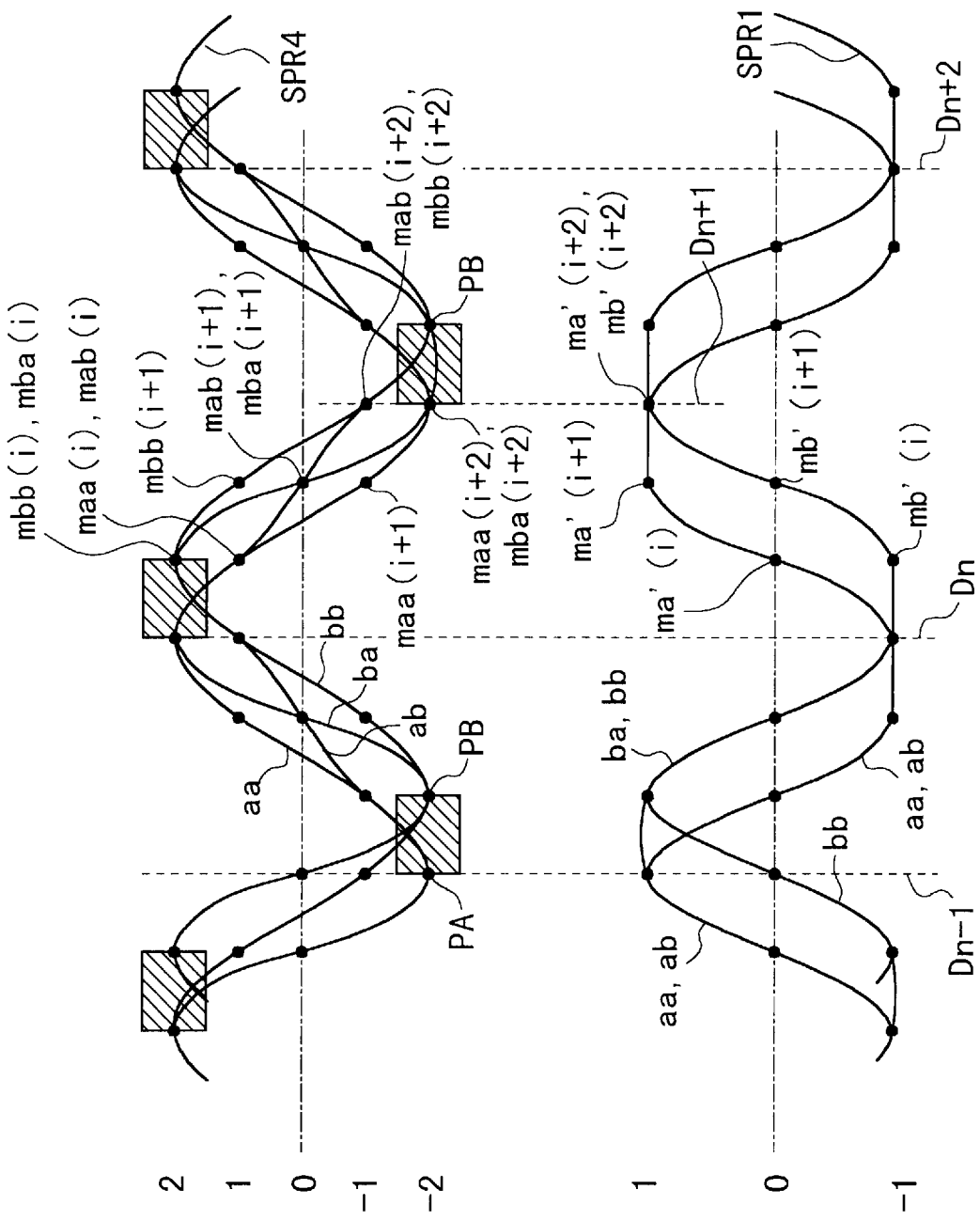
FIGS. 5A and 5B are a signal waveform chart illustrating relations between two equalized signals from the provisional discrimination process illustrated in FIGS. 3A through 3D.

As shown in FIG. 5B, as compared with the EPR4 equalized signal SPR4 shown in FIG. 5A, the PR1 equalized signal SPR1 may also be subjected to Viterbi decoding based on provisional discrimination, similarly. For the PR1 equalized signal SPR1, the paths "aa" through "bb" are also shown corresponding to the paths "aa" through "bb" of the EPR4 equalized signal SPR4.

Where the number of states is reduced in decoding the EPR4 equalized signal SPR4 as described, high frequency components of noise result in tending to be emphasized. This causes a deterioration of discrimination accuracy. By contrast, the PR1 equalized signal SPR1 has its low frequency noise components emphasized to compensate for the emphasized high frequency noise components. Effects of these noise components will be reflected in the branch metrics computed for each path. This embodiment, for its part, performs Viterbi decoding by supplementing the branch metrics calculated for the EPR4 equalized signal SPR4, with the branch metrics computed for the corresponding PR1 equalized signal SPR1. This permits detection of the decoded results with the frequency characteristics of noise indirectly equalized.

Through continuous receipt of the provisionally discriminated signal S2, a state detecting circuit 5 (FIG. 1) outputs amplitude reference values "maa" through "mbb" for the paths "aa" through "bb" of the EPR4 equalized signal SPR4, said reference values corresponding to the timings of the signal S2. Likewise, the state detecting circuit 5 outputs amplitude reference values "ma'" and "mb'" for the paths "aa" through "bb" of the PR1 equalized signal SPR1. In addition, the circuit 5 detects timing Dn−1, Dn, . . . at which the paths "aa" through "bb" converge, and outputs a convergence timing signal ST.

Figure 6:
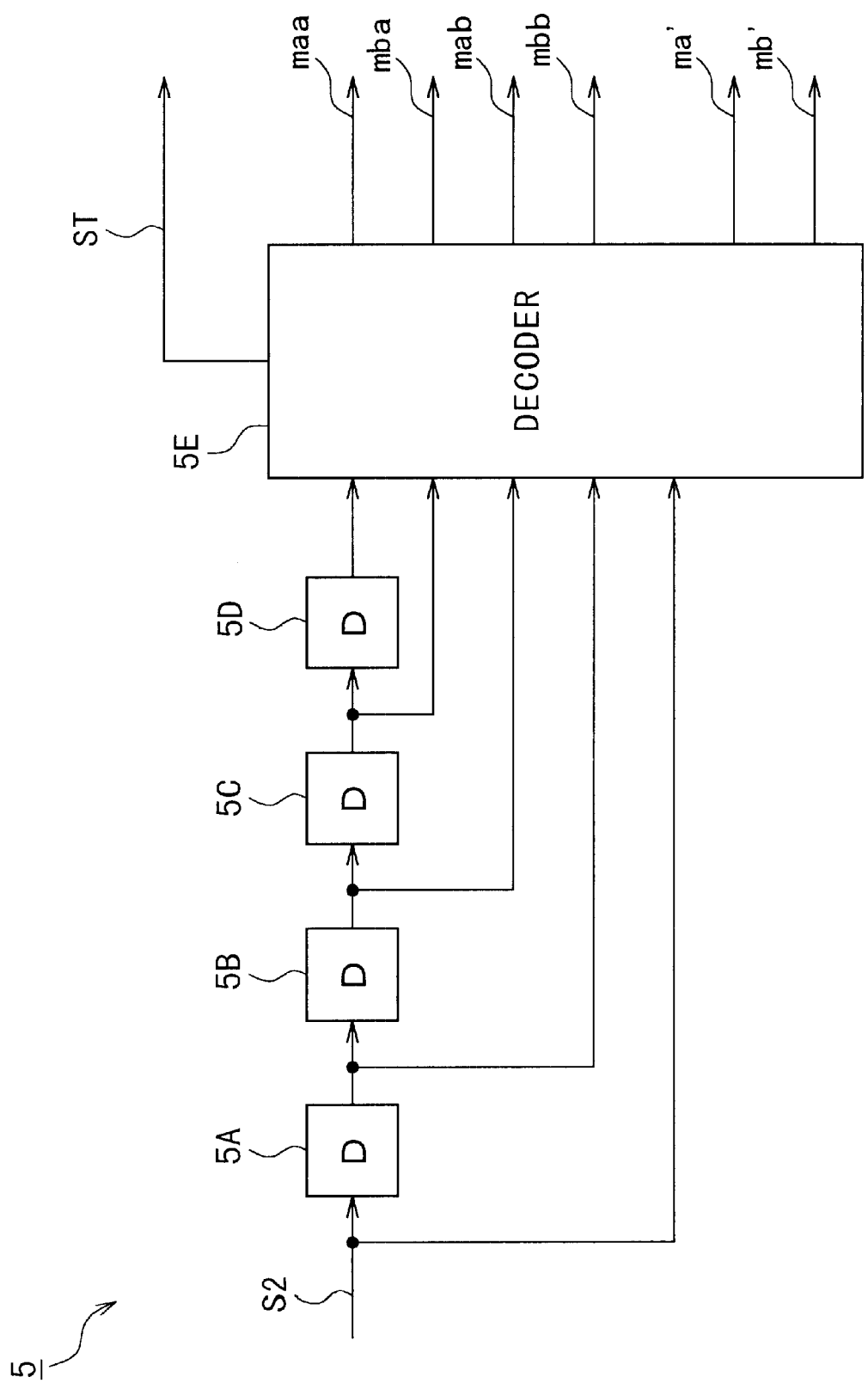
FIG. 6 is a block diagram of a state detecting circuit in the Viterbi decoder of FIG. 1.

As shown in FIG. 6, the state detecting circuit 5 has a series circuit made of four delay circuits 5A through 5D (D). Each of the delay circuits 5A through 5D constituting the series circuit delays the provisionally discriminated signal S2 sequentially by one clock cycle. A decoder 5E gains access to a built-in memory using as its address a continuous five-bit provisionally discriminated signal S2 generated by the series circuit. The access entails an output of the timing signal ST and the amplitude reference values "maa" through "mbb," "ma'," and "mb'" over the paths "aa" through "bb."

When the paths "aa" through "bb" converge, as shown at times t1 and t2 in FIG. 4D, the state detecting circuit 5 outputs the same value for the corresponding amplitude reference values "maa" through "mbb." More specifically, at time t1, the state detecting circuit 5 outputs the amplitude reference values "maa" and "mab" at value 2 over the paths "aa" and "ab", and outputs the amplitude reference values "mba" and "mbb" at value 1 over the paths "ba" and "bb". At time t2, the state detecting circuit 5 outputs the amplitude reference values "mba" and "mbb" at value 2 over the paths "ba" and "bb", and outputs the amplitude reference values "maa" and "mab" at value 1 over the paths "aa" and "ab". At time t3, the state detecting circuit 5 outputs the amplitude reference values "maa" through "mbb" at value −1 over the path "aa", at value 0 over the paths "ab" and "ba", and at value 1 over the path "bb."

A branch metric computing circuit 6 (FIG. 1) carries out the operations below to compute branch metrics "Maa" through "Mbb" successively for the EPR4 equalized signal SPR4 with regard to the amplitude reference values "maa" through "mbb." The branch metric computing circuit 6 admits the amplitude reference values "maa" through "mbb" into its four subtracters, respectively. Each subtracter computes a difference between one of the amplitude reference values "maa" through "mbb" and the EPR4 equalized signal SPR4. The branch metric computing circuit 6 uses its squaring circuit to square the difference output by each subtracter, thereby computing the branch metrics "Maa" through "Mbb". The operations involved are as follows:

$$Maa(i)=\{epr4(i)-maa(i)\}^2 \qquad (4\text{-}1)$$

$$Mba(i)=\{epr4(i)-mba(i)\}^2 \qquad (4\text{-}2)$$

$$Mab(i)=\{epr4(i)-mab(i)\}^2 \qquad (4\text{-}3)$$

$$Mbb(i)=\{epr4(i)-mbb(i)\}^2 \qquad (4\text{-}4)$$

Likewise, a branch metric computing circuit 7 carries out the operations below to compute branch metrics "Ma'" and "Mb'" successively with regard to the amplitude reference values "ma'" and "mb'". The results are outputted in timed relation with the output of the branch metric computing circuit 6. The operations are as follows:

$$Ma'(i)=\{pr1(i-2)-ma'(i)\}^2 \qquad (5\text{-}1)$$

$$Mb'(i)=\{pr1(i-2)-mb'(i)\}^2 \qquad (5\text{-}2)$$

Furthermore, the branch metric computing circuit 7 weights the branch metrics "Ma'" and "Mb'" computed above, respectively, using a predetermined weighting factor "q" and outputs the weighted metrics. The weighting factor "q" is selected so that frequency characteristics of noise components are equally flattened in keeping with the characteristic of a recording and reproducing system of this video tape recorder, i.e., so that frequency characteristics equivalent to those given when the white noise is superimposed on the EPR4 equalized signal SPR4 are in effect.

Adders 8aa through 8bb add branch metrics "qMa'" and "qMb'" outputted by the branch metric computing circuit 7 over the paths "aa" and "bb", to the branch metrics "Maa" through "Mbb" outputted by the branch metric computing circuit 6 over the paths "aa" through "bb." The adders output the sums of the additions.

A branch metric processing circuit 10 is composed of branch metric processing units 10A and 10B. The branch metric processing unit 10A corresponds to two paths "aa" and "ba" stemming from a leading edge of the binary signal S2, and the branch metric processing circuit 10B corresponds to two paths "ab" and "bb" based on a trailing edge of the binary signal S2. That is, the branch metric processing circuit 10 selects the path of maximum likelihood by computing the metrics over the paths "aa", "ba", "ab" and "bb" by means of the branch metric processing units 10A and 10B; the two paths "aa" and "ba" converging on a sampled point corresponding to a leading edge are handled by the branch metric processing unit 10A, and the two paths "ab" and "bb" converging on a sampled point corresponding to a trailing edge are dealt with by the branch metric processing unit 10B.

Figure 7:
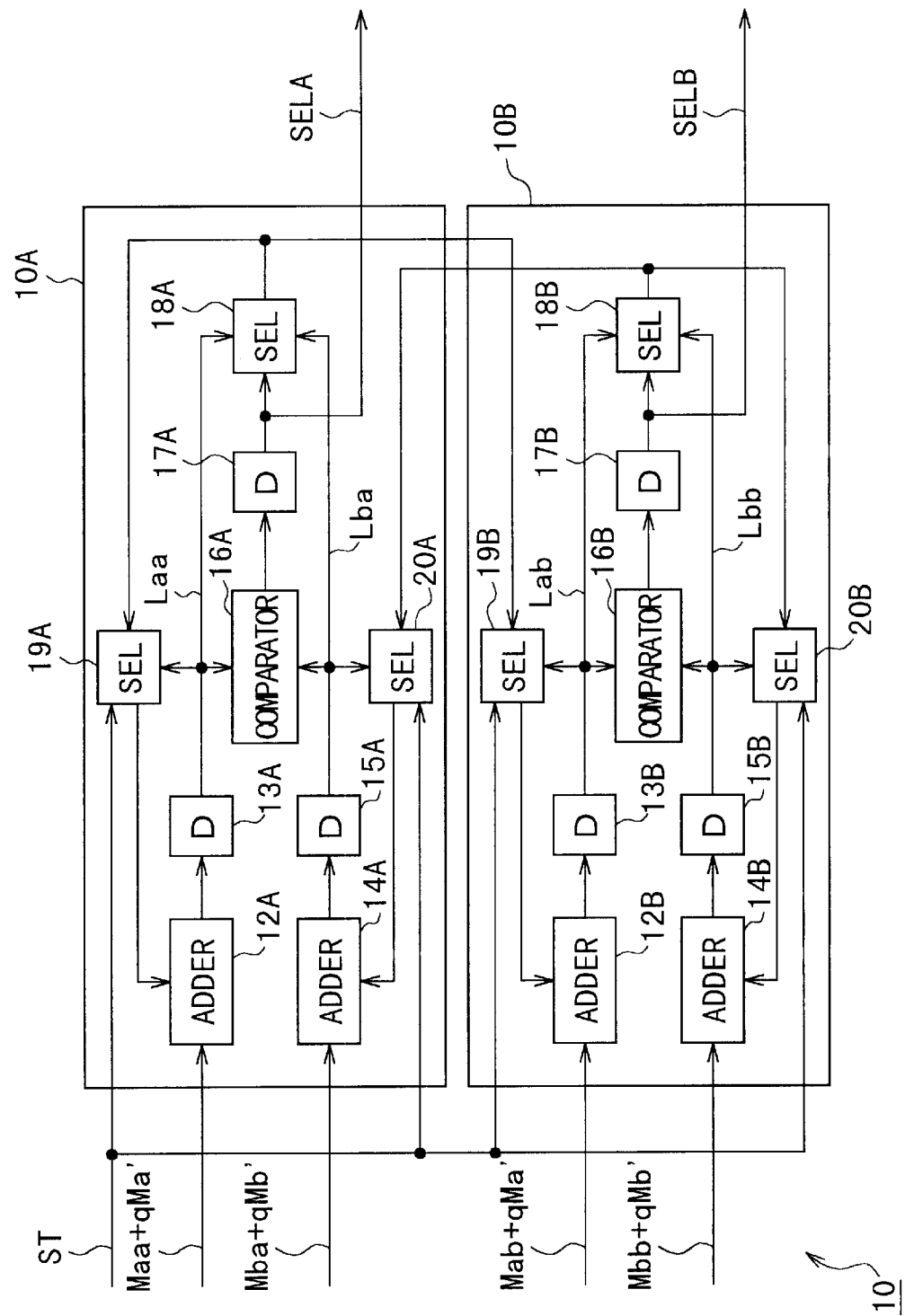
FIG. 7 is a block diagram of a branch metric processing circuit in the Viterbi decoder of FIG. 1.

As shown in FIG. 7, the first branch metric processing unit 10A inputs a branch metric "Maa+qMA'" on the path "aa" to an adder 12A. The adder 12A adds the input branch metric to the metric of the path "aa" in one sampling cycle earlier. A delay circuit (D) 13A latches the sum outputted by the adder 12A.

An adder 14A adds the metric on the path "ab" in one sampling cycle earlier, to a branch metric "Mba+qMb'" on the path "ba." A delay circuit (D) 15A latches the sum outputted by the adder 14A. A comparator 16A compares the output signal from the delay circuit 13A with that from the delay circuit 15A to select the smaller one out of the metrics on the paths "aa" and "ba."

A delay circuit (D) 17A latches the compared result of the comparator 16A and holds the result. On the basis of the compared result held in the delay circuit 17A, a selector 18A selectively outputs the metrics held in the delay circuits 13A and 15A. In such a case, as described above with reference to FIG. 4D, one path is formed subsequent to the converging point corresponding to the leading edge. Branch metrics of an equal value are added to two paths "aa" and "ba" previous to the converging point.

In that case, the metrics computed over the paths "aa" and "ba" are retained temporarily in the delay circuits 13A and 15A before being compared by the comparator 16A, followed by selection of the selector 18A. That is, even when, according to the result of the comparison of the metrics in one clock cycle earlier, subsequent metric is selected, this still permits selection of correct metrics needed for the subsequent metric computations.

In the first branchmetric processing unit 10A, a selector 19A selectively outputs to the adder 12A the metric selected by the selector 18A, in preference to the metric held in the delay circuit 13A with regard to the timing signal ST. In this manner, the metrics at converging points Dn−2, Dn−1, Dn, . . . are selected on the basis of the result of the metrics compared at time in one clock cycle earlier with respect to the amplitude reference values of 2 and −2 (at time t1 in FIG. 4D) corresponding to leading edges.

A selector 20A selectively outputs to the adder 14A the metric computed by the second branch metric processing unit 10B, in preference to the metric retained by the delay circuit 15A with regard to the timing signal ST. This allows the metric to be selected in timed relation with a leading edge based on the compared result of similar timings. As a result, the first branch metric processing unit 10A computes metrics over two paths in two clock cycles, obtains the result of comparison between the metrics and computes the metric.

Likewise, the second branch metric processing unit 10B inputs to an adder 12B a branch metric "Mab+qMa'" on the path "ab." The adder 12B adds the input branch metric to the metric on the path "ab" in one sampling cycle earlier. A delay circuit (D) 13B latches the sum outputted by the adder 12B.

An adder 14B adds the metric on the path "bb" in one sampling cycle earlier to a branch metric "Mbb+qMb'" on the path "bb." A delay circuit (D) 15B latches the sum outputted by the adder 14B. A comparator 16B compares the output signal from the delay circuit 13B with that from the delay circuit 15B to select the smaller one out of the metrics on the paths "ab" and "bb."

A delay circuit (D) 17B latches the compared result of the comparator 16B. On the basis of the compared result retained in the delay circuit 17B, a selector 18B selectively outputs the metrics held in the delay circuits 13B and 15B. In such a case, one path is formed subsequent to a converging point of the paths "ab" and "bb" corresponding to a trailing edge. Branch metrics of an equal value are added to the metrics on the paths "ab" and "bb" at a sampled point following the converging point.

A selector 19B selectively outputs to the adder 12B the metric computed by the first branch metric processing unit 10A, in preference to the metric retained by the delay circuit 13B with regard to the timing signal ST. The metric in timed relation with a trailing edge is selected on the basis of the result of the metrics compared at time in one clock cycle earlier with respect to the amplitude reference values of 2 and −2 (at time t2 in FIG. 4D) corresponding to the trailing edge. That is, according to the result of the comparison of the metrics in one clock cycle earlier, subsequent metric is selected.

A selector 20B selectively outputs the metric selected by the selector 18B, in preference to the metric held in the delay circuit 15B with regard to the timing signal ST. This likewise permits selection of the metric in timed relation with a trailing edge. In turn, the second branch metric processing unit 10B computes metrics over two paths in two clock cycles, obtains the result of comparison between the metrics, and computes the metric at a converging point of the paths.

The branch metric processing circuit 10 outputs the compared results held in the delay circuits 17A and 17B as selection signals SELA and SELB.

At converging points Dn−2, Dn−1, Dn, . . . , the branch metric processing circuit 10 carries out the operations below to select successively paths of high likelihood (paths with small metrics) from among those leading to the converging points Dn−2, Dn−1, Dn. etc. The selected results are outputted as the selection signals SELA and SELB. In the expressions below, min (A, B) represents a process for selecting a value smaller than A and B:

$$LA(n+1) = \min[LA(n) + Maa(i) + Maa(i+1) + \\ Maa(i+2) + q*\{Ma'(i) + Ma'(i+1) + Ma'(i+2)\}, \\ LB(n) + Mba(i) + Mba(i+1) + Mba(i+2) + \\ q*\{Mb'(i) + Mb'(i+1) + Mb'(i+2)\}] \quad (6\text{-}1)$$

-continued $$LB(n+1) = \min[LA(n) + Mab(i) + Mab(i+1) + \\ Mab(i+2) + q*\{Ma'(i) + Ma'(i+1) + Ma'(i+2)\}, \\ LB(n) + Mbb(i) + Mbb(i+1) + Mbb(i+2) + \\ q*\{Mb'(i) + Mb'(i+1) + Mb'(i+2)\}] \quad (6\text{-}2)$$

Shift registers 22A and 22B (FIG. 1) constitute a path memory unit. In response to the selection signals SELA and SELB, one of the shift registers 22A and 22B selectively transfers either its own hysteresis or the hysteresis retained by the other shift register. This provides a discriminated binary signal output D1.

Figure 8:
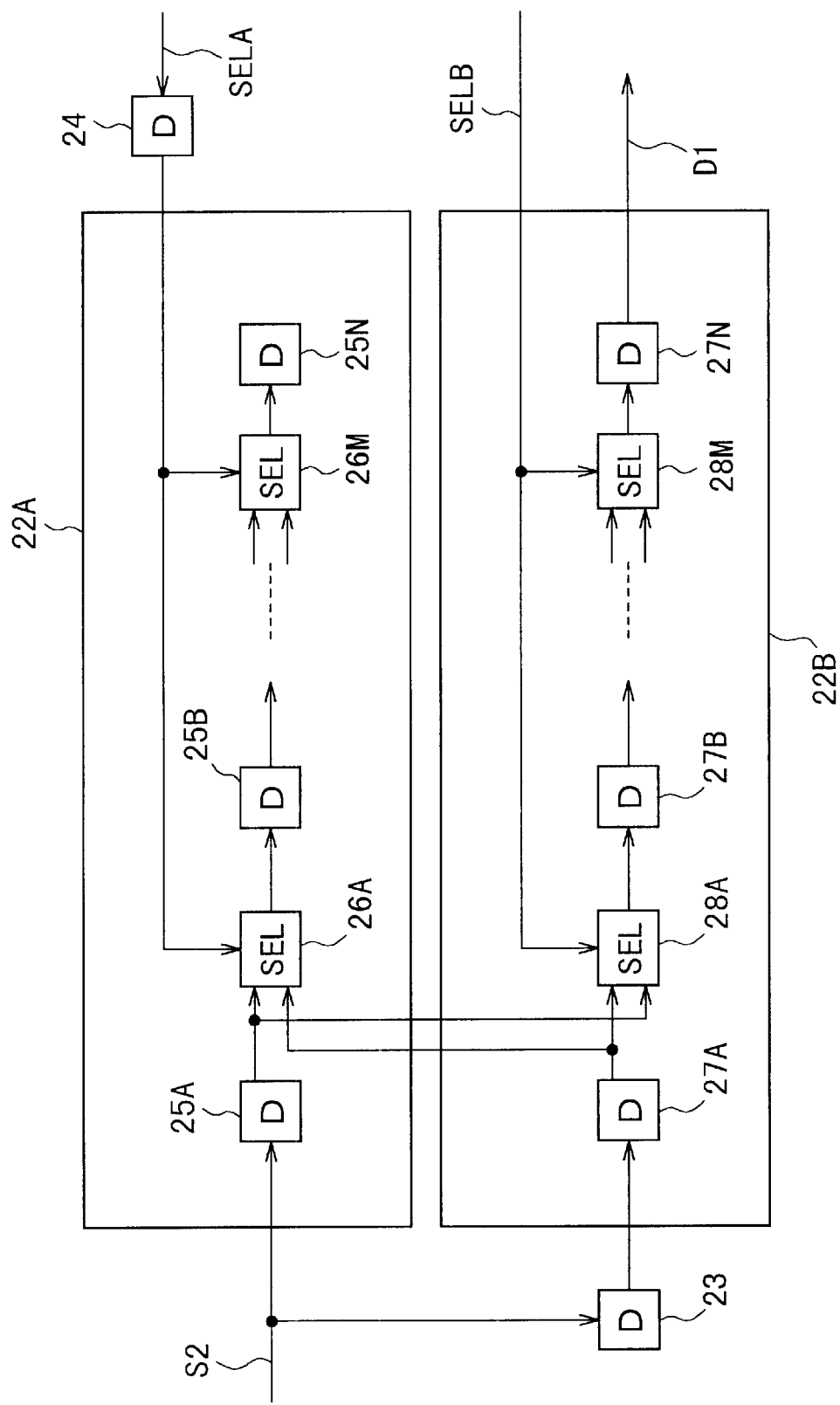
FIG. 8 is a block diagram of shift registers in the Viterbi decoder of FIG. 1.

FIG. 8 is a block diagram showing the shift registers 22A and 22B. The first shift register 22A comprises a predetermined number of latches (D) 25A through 25N for latching hysteresis, and selectors 26A through 26M for selectively outputting hysteresis to the latches 25A through 25N with the exception of the first stage latch 25A. The first stage latch 25A of the shift register 22A receives a provisionally discriminated signal S2. The shift register 22A switches contacts of the selectors 26A through 26M based on the selection signal SELA inputted through a delay circuit (D) 24 for timing correction. In response to the path selected by the branch metric processing unit 10A, the shift register 22A selects either its own hysteresis held in the latches 25A through 25M or the hysteresis retained in the corresponding latches 27A through 27M in the shift register 22B. The selected hysteresis is outputted to the latches 25B through 25N.

The second shift register 22B likewise includes a predetermined number of latches (D) 27A through 27N for holding hysteresis, and selectors 28A through 28M for selectively outputting the hysteresis to the latches with the exception of the first stage latch 27A. The first stage latch 27A of the shift register 22B receives the provisionally discriminated signal S2 through a delay circuit (D) 23 for timing correction. The shift register 22B switches contacts of the selectors 28A through 28M in synchronism with the selector changeover in the first shift register 22A by use of the selection signal SELB. In response to the path selected by the branch metric processing unit 10B, the shift register 22B selects either its own hysteresis held in the latches 27A through 27M or the hysteresis retained in the corresponding latches 25A through 25M in the shift register 22A. The selected hysteresis is outputted to the latches 27B through 27N.

In the first and the second shift register 22A and 22B, the latches 25A through 25N and 27A through 27N, as well as selectors 26A through 26M and 28A through 28M are furnished in their predetermined numbers so that the retained hysteresis will be consistent downstream of these latches and selectors.

(1-2) Operation of the First Embodiment

In the constitution described above, the reproduced signal obtained through the magnetic head is subjected to Nyquist equalization before being converted by an analog-digital converting process to a digital reproduced signal DRF.

The PR (1, 1) equalizer 2 equalizes the digital reproduced signal DRF (FIG. 1) by use of PR1 equalizing characteristics of an integrating system, thus converting to a PR1 equalized signal SPRL that has the amplitude reference values of 0, 1 and 2 (FIGS. 2A through 2C). The subsequent EPR4 equalizer 3 equalizes the PR1 equalized signal SPR1 by use of EPR4 equalizing characteristics of a differential system, thereby generating an EPR4 equalized signal SPR4.

In this manner, the digital reproduced signal DRF is converted to a PR1 equalized signal SPR1 with sufficient margins for discrimination. Then, the binary discriminating circuit 4 puts the PR1 equalized signal SPR1 into binary form with respect to the amplitude reference value of 1, whereby the provisionally discriminated signal S2 is generated (FIGS. 3A through 3D).

The provisionally discriminated signal S2 (FIGS. 3A through 3C) is put into binary form with sufficient margins of discrimination (in the range between amplitude reference values of 0 and 2). The recorded signal SREC corresponding to the reproduced signal RF is generated in RLL (1, 7) code under the d=1 restriction. This means that although edge timings involve one-clock error, the reproduced signal SREC is correctly discriminated except for the edge error.

In the state detecting circuit 5, the provisionally discriminated signal S2 (FIG. 6) is transferred successively through the delay circuits 5A through 5D. The resulting successive five-bit parallel data are used as a basis for access to the decoder 5E. Given the edge error, the amplitude reference values "maa" through "mbb" (one of values 2, 1, 0, −1 and −2) of the paths "aa" through "bb" are generated successively over the four paths "aa" through "bb" (FIGS. 4D and 5A), any of which may be taken by the EPR4 equalized signal SPR4. There is generated a timing signal ST corresponding to a converging point where the four paths "aa" through "bb" converge. Simultaneously and in parallel with the processing of the EPR4 equalized signal SPR4, the amplitude reference values "ma'" through "mb'" (one of values 1, 0 and −1 in comparison with FIG. 5A) are generated successively over the four paths "aa" through "bb" (FIG. 5B), any of which may be taken by the PR1 equalized signal SPR1. There is also generated a timing signal ST corresponding to a converging point where these four paths "aa" through "bb" converge.

In the manner described, the Viterbi decoder 1 computes metrics successively over the four paths regarding six states, any of which may be taken by the digital reproduced signal DRF.

The branch metric computing circuit 6 successively finds differences between the EPR4 equalized signal SPR4 (FIG. 1) and each of the amplitude reference values "maa" through "mbb" computed by the state detecting circuit 5 for the paths "aa" through "bb". Branch metrics "Maa" through "Mbb" over the paths "aa" through "bb" is computed by squaring each of the differences thus acquired.

Likewise, the branch metric computing circuit 7 successively finds differences between the PR1 equalized signal SPR1 and each of the amplitude reference values "ma'" and mb'" computed by the state detecting circuit 5 for the paths "aa" through "bb". Branch metrics "Ma'" and "Mb'" over the paths "aa" through "bb" is computed by squaring each of the differences thus obtained. The branch metrics "Ma'" and "Mb'" on the paths "aa" through "bb" are weighted by use of a predetermined weighting factor "q" before being outputted.

The branch metrics "Maa" through "Mbb," "qMa'" and "qMb'" thus computed are added by the adders 8aa through 8bb for each of the corresponding paths "aa" through "bb". This generates branch metrics "Maa+qMa'", "Mab+qMa'", "Mba+qMb'" and "Mbb+qMb'" in which frequency characteristics of the noise components whose pronounced low frequencies were superimposed on the PR1 equalized signal SPR1 are flattened and corrected.

Of the branch metrics "Maa+qMa'", "Mab+qMa'", "Mba+qMb'" and "Mbb+qMb'", those "Maa+qMa'" and "Mba+qMb'" corresponding to a leading edge are added by the first branch metric processing unit 10A (FIG. 7) to the path metrics outputted by the selectors 19A and 20A. This calculates metrics "Laa" and "Lba" for a subsequent sampled point. The metrics "Laa" and "Lba" are latched by the delay circuits 13A and 15A before being compared by the comparator 16A. According to the compared result obtained through the delay circuit 17A, the selector 18A selects the smaller one out of the metrics (higher likelihood).

The selected metric is thus selected by the selector 18A based on the compared result inputted through the delay circuit 17A. The metric of the point where the two paths "aa" and "ba" converge is outputted to the adder 12A on the basis of the compared result of metrics in one clock cycle earlier compared with the timing of the amplitude reference values of 2 and −2 corresponding to a leading edge. The metric is also outputted to the corresponding adder 12B in the second branch metric processing unit 10B. As a whole, the metrics are computed, compared and updated in two sampling cycles. That is, the metrics are computed appropriately with regard to the reproduced signal RF at a high transfer rate.

In like manner, of the branch metrics "Maa+qMa'", "Mab+qMa'", "Mba+qMb'" and "Mbb+qMb'", those "Mab+qMa'" and "Mbb+qMb'" corresponding to a trailing edge are added by the second branch metric processing unit 10B to the previous metrics on the paths "ab" and "bb." This calculates metrics "Lab" and "Lbb" on the paths "ab" and "bb." Then, the calculated metrics are compared by the comparator 16B, and one of the metrics is selected as a result of the comparison.

With the metric thus selected, the metric of the point where the two paths "ab" and "bb" converge is outputted to the adder 14B on the basis of the compared result of metrics in one clock cycle earlier compared with the timing of the amplitude reference values of 2 and −2 corresponding to a trailing edge. The metric is also outputted to the corresponding adder 14A in the first branch metric processing unit 10A. As a whole, the metrics are computed, compared and updated in two sampling cycles. That is, the metrics are computed reliably with respect to the reproduced signal RF at a high transfer rate.

The results of the comparison of metrics by the comparators 16A and 16B are outputted as selection signals SELA and SELB to the shift registers 22A and 22B constituting the path memory unit.

To the shift registers 22A and 22B (FIG. 8), the provisionally discriminated signal S2 is inputted directly or through the delay circuit 23. That is, the provisionally discriminated signal S2 is inputted in timed relation with the first and the second branch metric processing unit 10A and 10B each corresponding to a one-clock error. The inputted signal S2 is transferred successively through the latches 25A through 25N or 27A through 27N. The signal S2 is switched to the other shift register 22B or 22A by the selection signal SELA or SELB. When the signal S2 has passed a predetermined number of latches in the other shift register, the contents held in the latch 25A through 25N and 27A through 27N corresponding to the paths of the digital reproduced signal DRF are set to an equal value derived from the discrimination of the recorded signal SREC. Thus, in the Viterbi decoder 1, the metrics are judged on four states corresponding to the one-clock cycle error each, and hysteresis is retained by the shift registers 22A and 22B for a leading and a trailing edge corresponding to the one-clock cycle error. This results in a high-speed discrimination capability implemented by a simplified apparatus constitution.

(1-3) Effects of the First Embodiment

In the above constitution, the branch metrics "Ma'" and "Mb'" generated from the PR1 equalized signal SPR1 of an integrating system and the branch metrics "Maa" through "Mbb" generated from the EPR4 equalized signal SPR4 of a differential system are added up in a weighted manner for each of the corresponding paths. This produces branch metrics "Maa+qMa'" through "Mbb+qMb'", with the frequency characteristics of the noise components flattened. When metrics are computed on the basis of the branch metrics "Maa+qMa'" through "Mbb+qMb'" for Viterbi decoding, the noise-induced decline in the accuracy of discrimination is made significantly less than before.

Paths are restricted with reference to the provisionally discriminated signal S2, and branch metrics are computed with respect to the limited paths. This makes it possible for a simplified device constitution to improve discrimination accuracy.

(2) Second Embodiment

Figure 9:
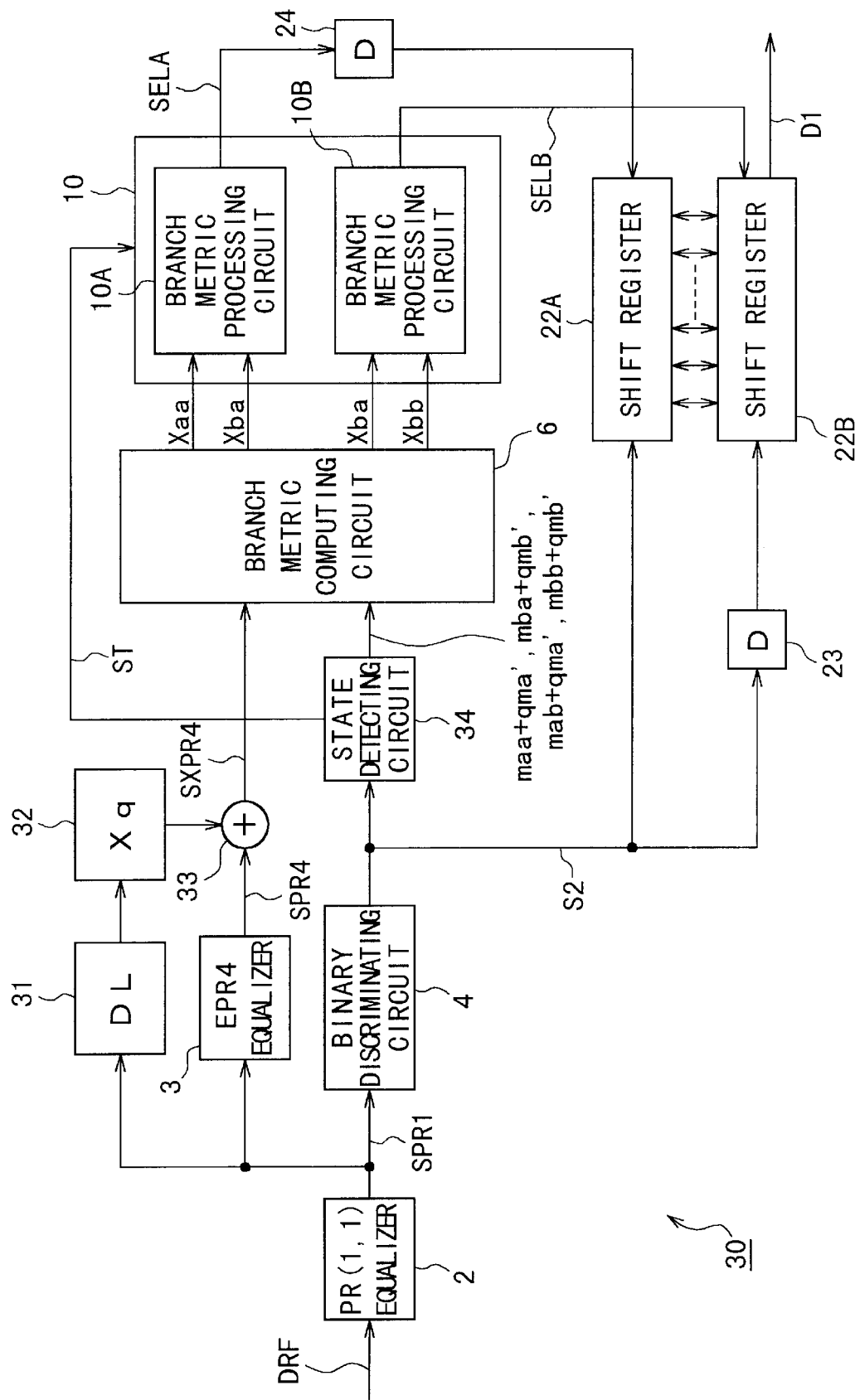
FIG. 9 is a block diagram of a Viterbi decoder of a second embodiment of this invention.

FIG. 9 is a block diagram showing a Viterbi decoder of the second embodiment of this invention. In describing this Viterbi decoder 30, the component parts with their functionally identical or equivalent counterparts shown in FIG. 1 are designated by like reference numerals, and repetitive descriptions are omitted.

In the Viterbi decoder 30, a delay circuit 31 receives a PR1 equalized signal SPR1 and delays it for a predetermined period of time before outputting it. A weighting circuit (x q) 32 weights the output data of the delay circuit 31 using a predetermined weighting factor "q" and outputs the weighted result. An adder 33 adds up the output data of the weighting circuit 32 in timed relation with an EPR4 equalized signal SPR4. In the second embodiment, the operation below is carried out and the PR1 equalized signal SPR1 and EPR4 equalized signal SPR4 are added up in a weighted manner with being in phase with each other, thus generating an equalized signal SXPR4 with noise frequency characteristics substantially flattened. The operation involved is:

$$SXPR4 = expr(i) \qquad (7)$$
$$= SPR4 + q*SPR1$$
$$= epr4(i) + q*pr1(i-2)$$

A state detecting circuit 34 generates and outputs amplitude reference values "maa+qma'", "mab+qma'", "mba+qmb'" and "mbb+qmb'" corresponding to the equalized signal SXPR4 above, as well as a timing signal ST corresponding to a converging point.

In turn, a branch metric computing circuit 6 carries out the operations below to generate branch metrics "Xaa" through "Xbb" successively. The operations involved are as follows:

$$Xaa(i)=[expr(i)-\{maa(i)+q*ma'(i)\}]^2 \qquad (8\text{-}1)$$

$$Xba(i)=[expr(i)-\{mba(i)+q*mb'(i)\}]^2 \qquad (8\text{-}2)$$

$$Xab(i)=[expr(i)-\{mab(i)+q*ma'(i)\}]^2 \qquad (8\text{-}3)$$

$$Xbb(i)=[expr(i)-\{mbb(i)+q*mb'(i)\}]^2 \qquad (8\text{-}4)$$

In the Viterbi decoder 30, the branch metrics "Xaa" through "Xbb" are inputted to branch metric processing units 10A and 10B wherein the operations below are carried out. This generates selection signals SELA and SELB similar to those used by the first embodiment. The selection signals SELA and SELB control the shift registers 22A and 22B in operation, whereby a discriminated result D1 is generated. The operations performed by the processing units 10A and 10B are as follows:

$$LA(n+1)=\min\{LA(n)+xaa(i)+xaa(i+1)+xaa(i+2), LB(n)+xba(i)+xba(i+1)+xba(i+2)\} \quad (9\text{-}1)$$

$$LB(n+1)=\min\{LA(n)+xab(i)+xab(i+1)+xab(i+2), LB(n)+xbb(i)+xbb(i+1)+xbb(i+2)\} \quad (9\text{-}2)$$

In the constitution of FIG. 9, when branch metrics is computed by adding up in a weighted fashion the equalized signal SPR1 having integrating system characteristics and the equalized signal SPR4 having differential system characteristics, this also provides the same results as the first embodiment. Because the number of multipliers and that of branch metric computing circuits are reduced, the overall device constitution may be simplified.

(3) Third Embodiment

Figure 10:
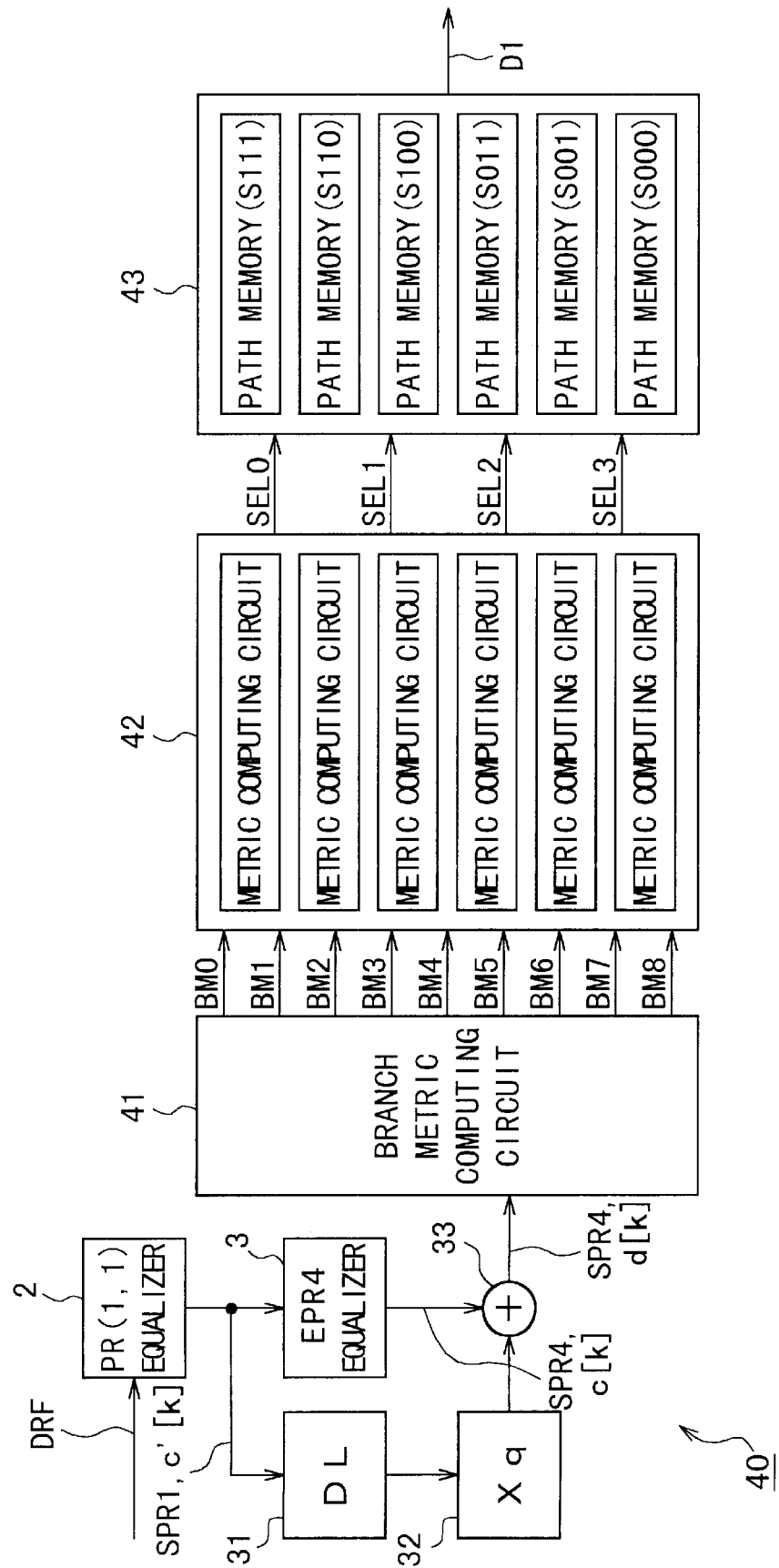
FIG. 10 is a block diagram of a Viterbi decoder of a third embodiment of this invention.

FIG. 10 is a block diagram showing a Viterbi decoder of the third embodiment of this invention. In this embodiment, a Viterbi decoder 40 adds up in a weighted manner an equalized signal SPR1 having integrating system characteristics and an equalized signal SPR4 having differential system characteristics, thereby generating an equalized signal SXPR4.

Figure 12:
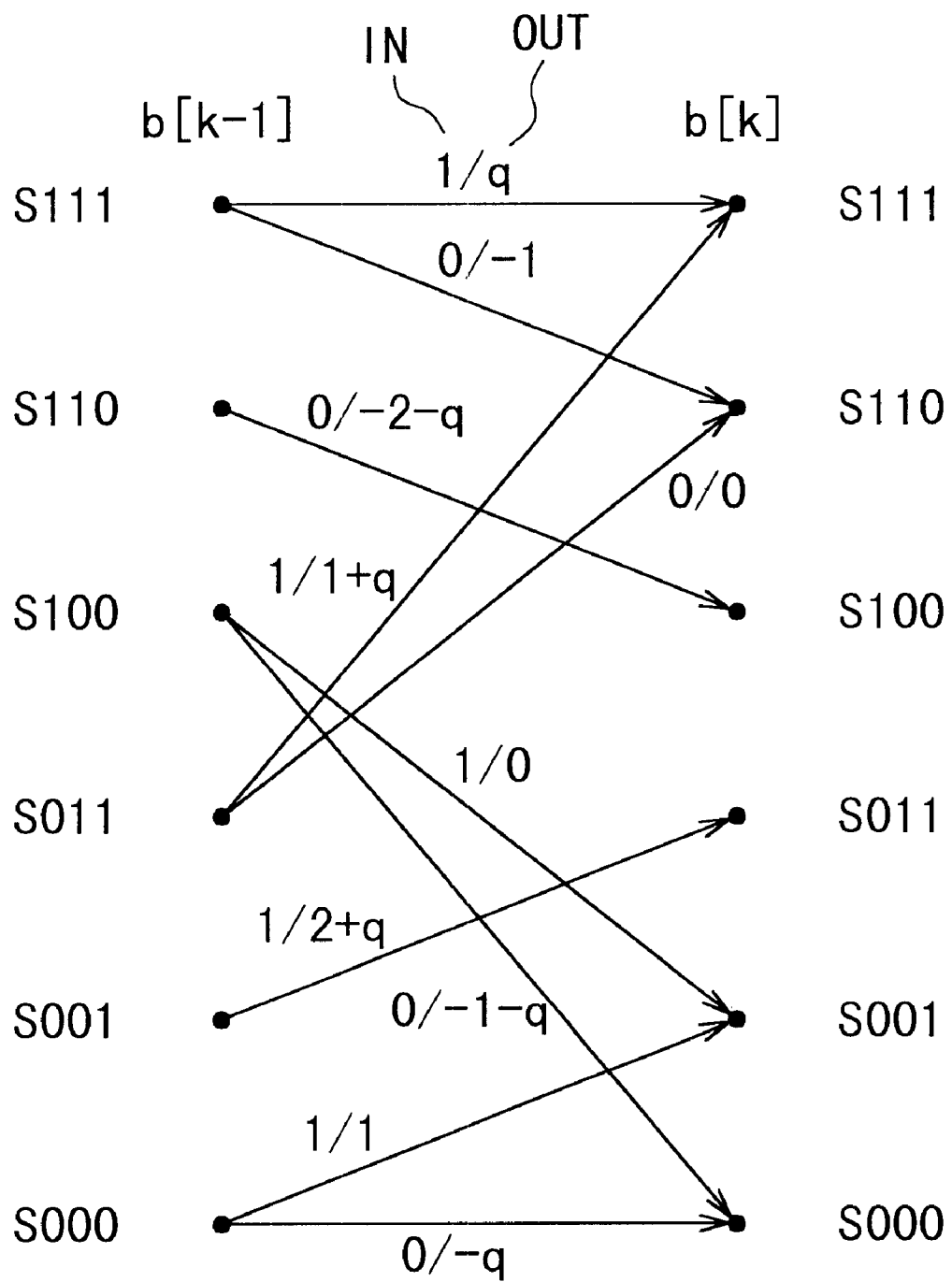
FIG. 12 is a trellis diagram derived from the table of FIG. 11.

The equalized signal SXPR4 thus generated effects state transitions shown in the table of FIG. 11 and in the trellis diagram of FIG. 12. With this embodiment, branch metrics "BM0" through "MB8" are computed every states involved, and a metric is computed every state transitions.

A branch metric processing circuit 42 receives the equalized signal SXPR4 and carries out the operations below every sampled values of the equalized signal SPR4. This computes branch metrics "BM0[k]" through "BM8[k]" on each of the amplitude reference values. The computed metrics are outputted. The operations involved are as follows:

$$BM0[k]=(\text{expr}[k]+k)^2 \quad (10\text{-}0)$$

$$BM1[k]=(\text{expr}[k]-1)^2 \quad (10\text{-}1)$$

$$BM2[k]=(\text{expr}[k]-2-q)^2 \quad (10\text{-}2)$$

$$BM3[k]=(\text{expr}[k])^2 \quad (10\text{-}3)$$

$$BM4[k]=(\text{expr}[k]-1-q)^2 \quad (10\text{-}4)$$

$$BM5[k]=(\text{expr}[k]+1+q)^2 \quad (10\text{-}5)$$

$$BM6[k]=(\text{expr}[k]+2+q)^2 \quad (10\text{-}6)$$

$$BM7[k]=(\text{expr}[k]+1)^2 \quad (10\text{-}7)$$

$$BM8[k]=(\text{expr}[k]-q)^2 \quad (10\text{-}8)$$

More specifically, a branch metric computing circuit 41 is composed of a plurality of subtracters and a plurality of multipliers. The subtracters subtract amplitude reference values from the digital reproduced signal DRF, and the multipliers square each of the differences obtained by the subtracters.

The branch metric processing circuit 42 carries out the operations below corresponding to the transitions shown in FIG. 12, using the branchmetrics "BM0[k]" through "BM8[k]" outputted from the branch metric computing circuit 41. This computes metrics (S000, k) through (S111, k) composed of the accumulated branch metrics regarding each of the states. The operations involved are as follows:

$$L(S111, k)=\min[L(S111, k-1)+BM8[k], (S011, k-1)+BM4[k]] \quad (11\text{-}1)$$

$$L(S110, k)=\min[L(S111, k-1)+BM7[k], (S011, k-1)+BM3[k]] \quad (11\text{-}2)$$

$$L(S100, k)=L(S110, k-1)+BM6[k] \quad (11\text{-}3)$$

$$L(S011, k)=L(S001, k-1)+BM2[k] \quad (11\text{-}4)$$

$$L(S001, k)=\min[L(S100, k-1)+BM3[k], (S000, k-1)+BM1[k]] \quad (11\text{-}5)$$

$$L(S000, k)=\min[L(S100, k-1)+BM5[k], (S000, k-1)+BM0[k]] \quad (11\text{-}6)$$

A path memory unit 43 outputs a binary decoded output D1 on the basis of computed results by the branch metric processing unit 42.

Figure 13:
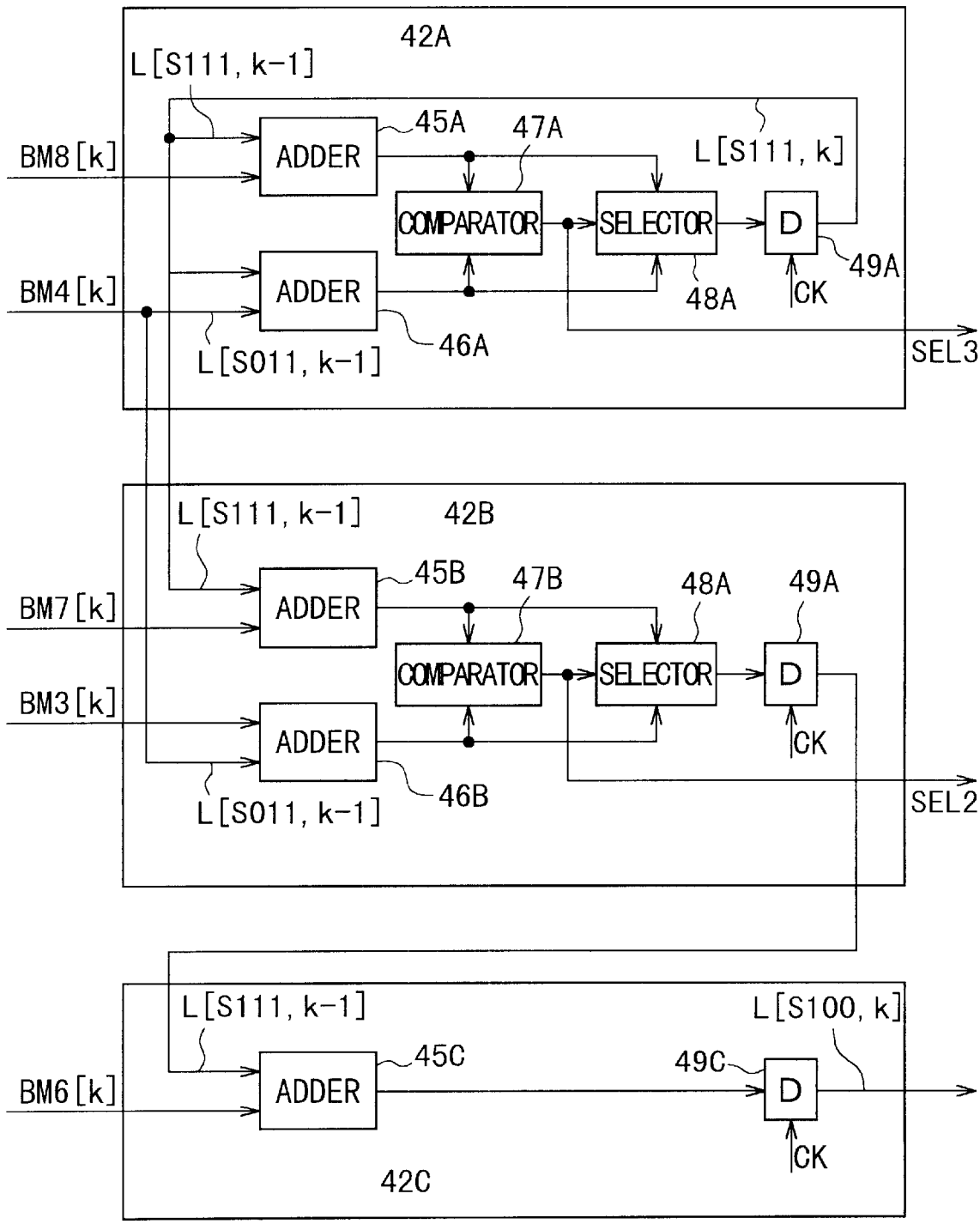
FIG. 13 is a block diagram of metric computing circuits included in FIG. 10.
Figure 14:
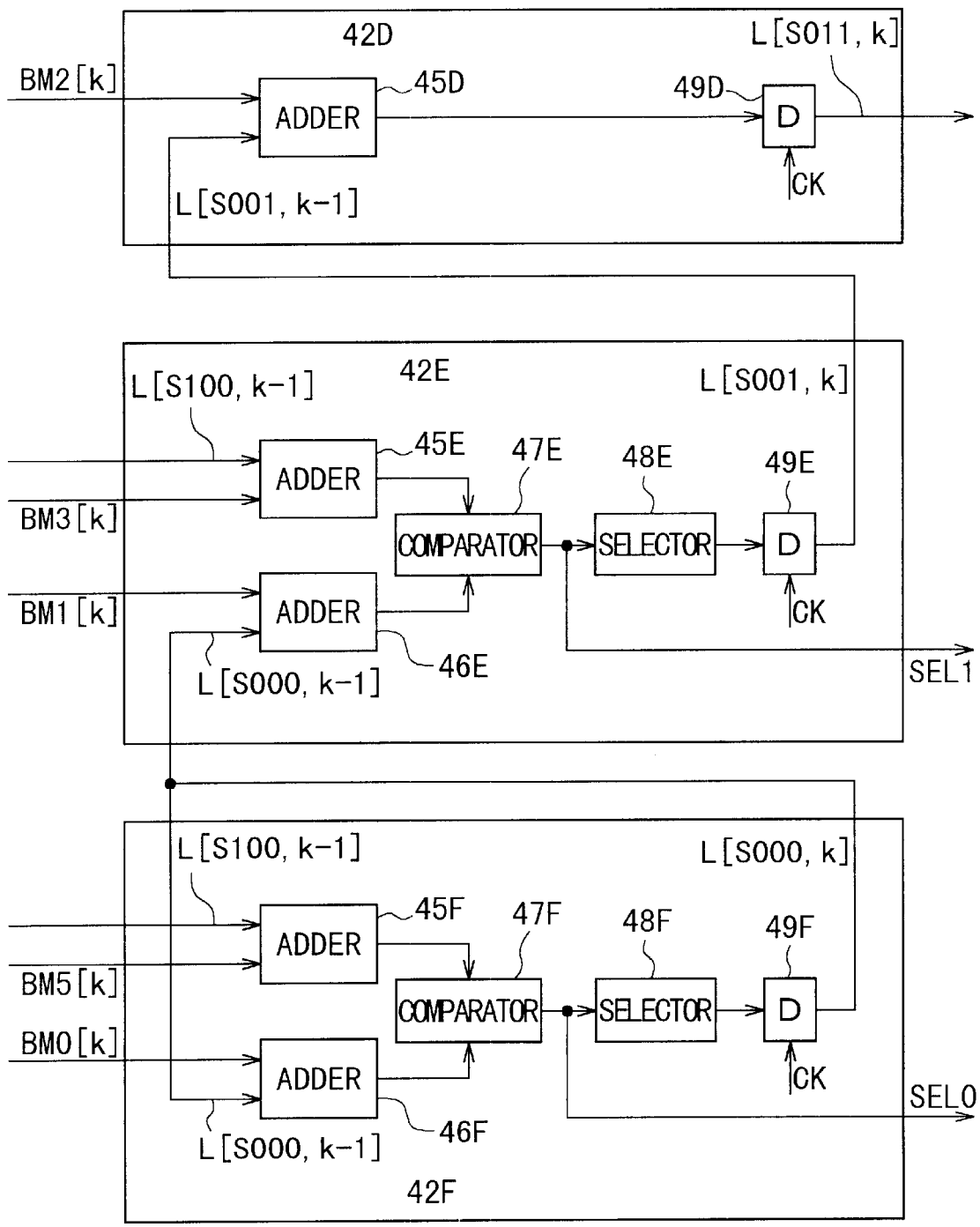
FIG. 14 is a block diagram continued from FIG. 13.

FIGS. 13 and 14 are block diagrams showing details of the branch metric processing circuit 42. The branch metric processing circuit 42 computes metrics corresponding to various states by use of metric computing circuits 42A through 42F.

A first metric computing circuit 42A calculates metrics about transitions to a state (S111). In the first metric computing circuit 42A, an adder 45A adds up a metric L (S111, k−1) computed in one clock cycle earlier (in state S111) and a branch metric BM8[k] calculated by the branch metric computing circuit 41 and outputs the sum. The adder 45A outputs the result of addition corresponding to a first term on the right-hand side of expression (11-1) above.

An adder 46A adds up a metric L (S011, k−1) computed in one clock cycle earlier (in state S011) by a fourth metric computing circuit 42D and a branch metric BM4[k] calculated by the branch metric computing circuit 41 and outputs the sum. The adder 46A outputs the result of addition corresponding to a second term on the right-hand side of expression (11-1) above.

A comparator 47A outputs the result of a comparison between the output data of the adders 45A and 46A. The comparison causes the comparator 47A to judge which of the states (S111) and (S011) is more likely to effect a transition to the state (S111). The comparator 47A outputs the result of the judgment SEL3.

Given the judged result SEL3 from the comparator 47A, a selector 48A selectively outputs the sum of the adder 45A or 46A. A latch (D) 49A latches the selective output from the selector 48A. The latch 49A thus latches and retains the result of the operations on the right-hand side of expression (11-1) above.

In a second metric computing circuit 42B, an adder 45B adds up a metric L (S111, k−1) computed in one clock cycle earlier (in state S111) by the first metric computing circuit 42A and a branch metric BM7[k] calculated by the branch metric computing circuit 41 and outputs the sum. The adder 45B outputs the result of addition corresponding to a first term on the right-hand side of expression (11-2) above.

An adder 46B adds up the metric L (S011, k−1) computed in one clock cycle earlier (in state S011) by the fourth metric computing circuit 42D and a branch metric BM3[k] calculated by the branch metric computing circuit 41 and outputs the sum. The adder 46B outputs the result of addition corresponding to a second term on the right-hand side of expression (11-2) above.

A comparator 47B outputs the result of a comparison between the output data of the adders 45B and 46B. The comparison causes the comparator 47B to judge which of the states (S111) and (S011) is more likely to effect a transition to the state (S100). The comparator 47B outputs the result of the judgment SEL2.

Given the judged result SEL2 from the comparator 47B, a selector 48B selectively outputs the sum of the adder 45B or 46B. A latch (D) 49B latches the selective output from the selector 48B. The latch 49B thus latches and retains the result of the operations on the right-hand side of expression (11-2) above, the result being the metric of the state (S110).

In a third metric computing circuit 42C, an adder 45C adds up a metric L (S110, k−1) computed in one clock cycle earlier (in state S110) by the second metric computing circuit 42B and a branch metric BM6[k] calculated by the branch metric computing circuit 41 and outputs the sum. The sum thereof is latched by a latch (D) 49C. The latch 49C thus latches and retains the result of the operations on the right-hand side of expression (11-3) above, the result being the metric of the state (S100).

In a fourth metric computing circuit 42D (FIG. 14), an adder 45D adds up a metric L (S001, k−1) computed in one clock cycle earlier (in state S001) by a fifth metric computing circuit 42E and a branch metric BM2[k] calculated by the branch metric computing circuit 41 and outputs the sum. A latch (D) 49D latches the sum. The latch (D) 49D thus latches and retains the result of the operations on the right-hand side of expression (11-4) above, the result being the metric of the state (S011).

In a fifth metric computing circuit 42E, an adder 45E adds up a metric L(S100, k−1) computed in one clock cycle earlier (in state S100) by the third metric computing circuit 42C and a branch metric BM3[k] calculated by the branch metric computing circuit 41 and outputs the sum. The adder 45E outputs the result of addition corresponding to a first term on the right-hand side of expression (11-5) above.

An adder 46E adds up a metric L (S000, k−1) computed in one clock cycle earlier (in state S000) by a sixth metric computing circuit 42F and a branch metric BM1[k] calculated by the branch metric computing circuit 41 and outputs the sum. The adder 46E outputs the result of addition corresponding to a second term on the right-hand side of expression (11-5) above.

A comparator 47E outputs the result of a comparison between the output data of the adders 45E and 46E. The comparison causes the comparator 47E to judge which of the states (S100) and (S000) is more likely to effect a transition to the state (S001) The comparator 47E outputs the result of the judgment SEL1.

Given the judged result SEL1 from the comparator 47E, a selector 48E selectively outputs the sum of the adder 45E or 46E. A latch (D) 49E latches the selective output from the selector 48E. The latch 49E thus latches and retains the result of the operations on the right-hand side of expression (11-2) above, the result being the metric of the state (S001).

In a sixth metric computing circuit 42F, an adder 45F adds up a metric L (S100, k−1) computed in one clock cycle earlier (in state S100) by the third metric computing circuit 42C and a branch metric BM5[k] calculated by the branch metric computing circuit 41 and outputs the sum. The adder 45F outputs the result of addition corresponding to a first term on the right-hand side of expression (11-6) above.

An adder 46F adds up a metric L (S000, k−1) computed in one clock cycle earlier (in state S000) by the sixth metric computing circuit 42F and a branch metric BM0[k] calculated by the branch metric computing circuit 41 and outputs the sum. The adder 46F outputs the result of addition corresponding to a second term on the right-hand side of expression (11-6) above.

A comparator 47F outputs the result of a comparison between the output data of the adders 45F and 46F. The comparison causes the comparator 47F to judge which of the states (S100) and (S000) is more likely to effect a transition to the state (S000). The comparator 47F outputs the result of the judgment SEL0.

Given the judged result SEL0 from the comparator 47F, a selector 48F selectively outputs the sum of the adder 45F or 46F. A latch (D) 49F latches the selective output from the selector 48F. The latch 49F thus latches and retains the result of the operations on the right-hand side of expression (11-6) above, the result being the metric of the state (S000).

Figure 15:
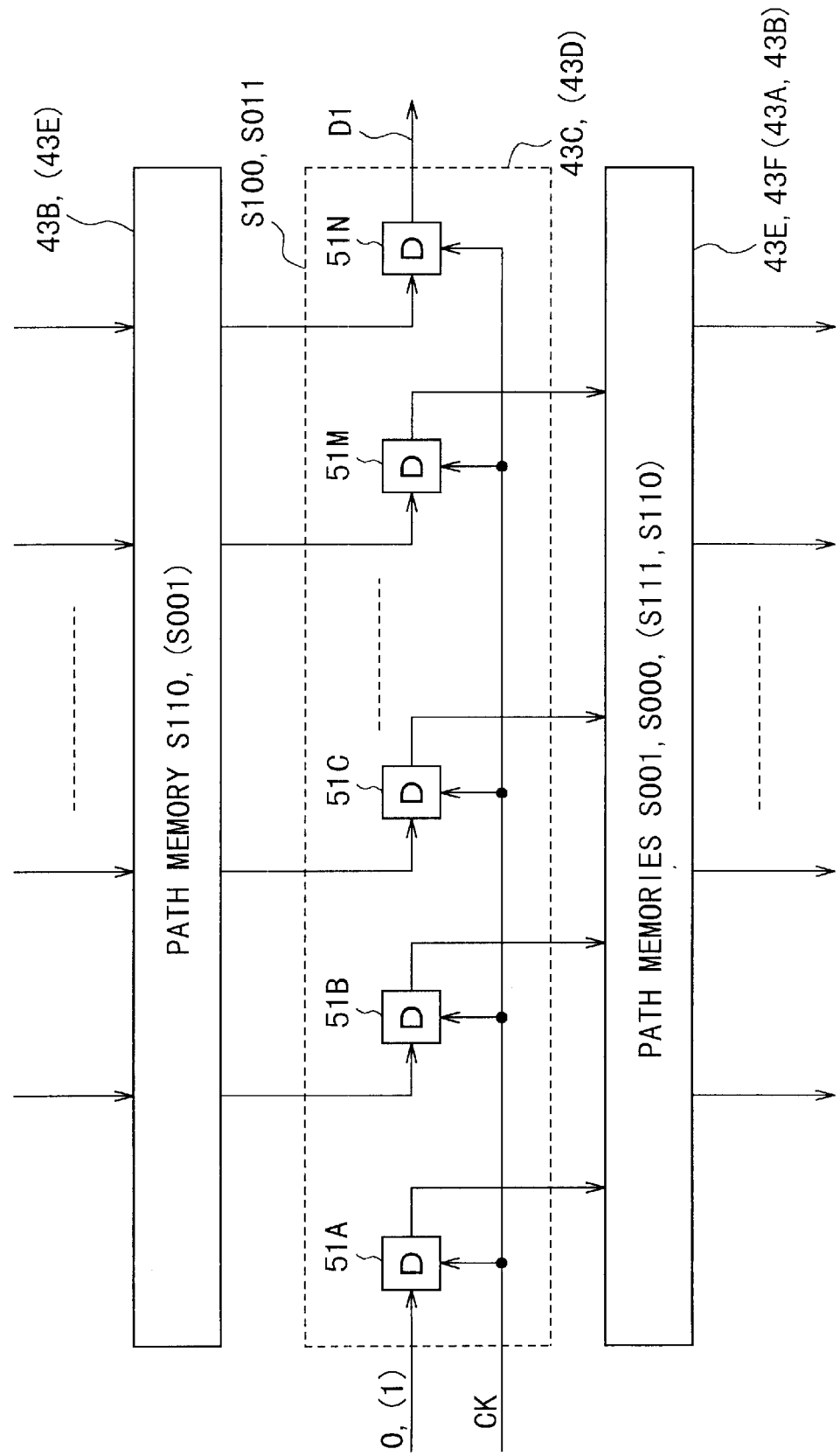
FIG. 15 is a block diagram showing path memories in FIG. 10.
Figure 16:
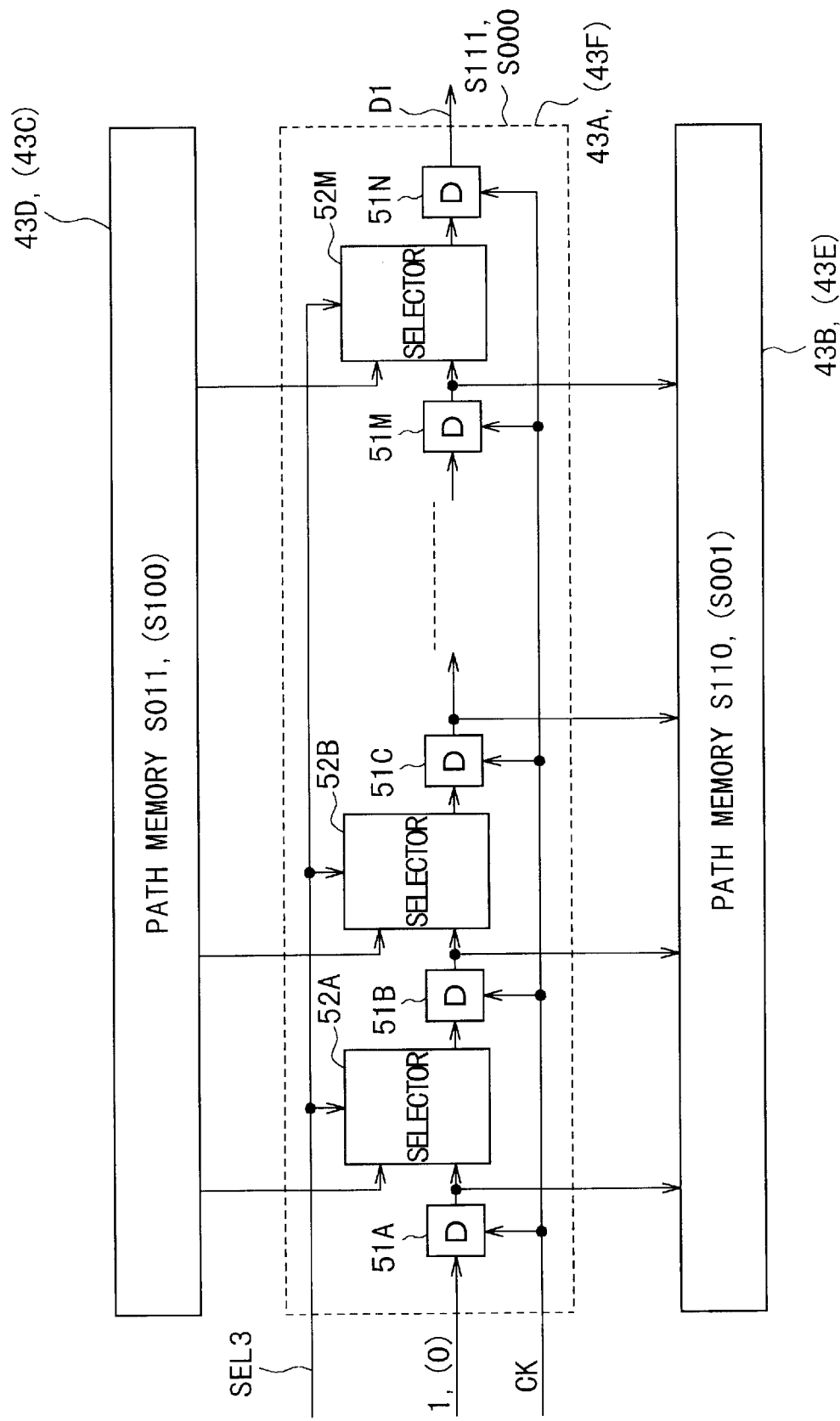
FIG. 16 is a block diagram showing other path memories in FIG. 10.
Figure 17:
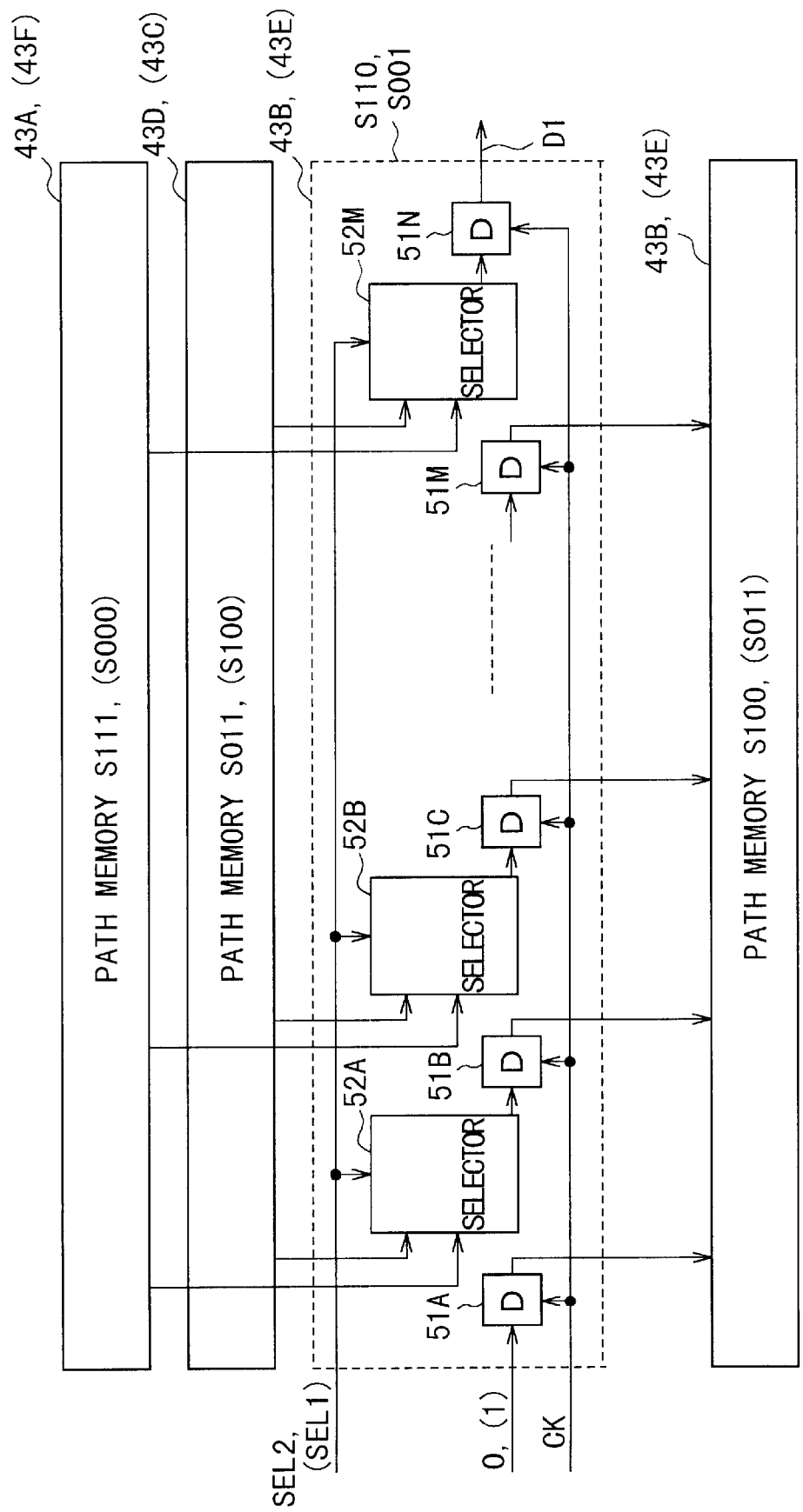
FIG. 17 is a block diagram of further path memories in FIG. 10.

FIGS. 15, 16 and 17 are block diagrams showing a path memory unit 43. The path memory unit 43 comprises six path memories 43A through 43F corresponding to the respective states involved. Each of the path memories 43A through 43F is composed of two path memories: those for selectively inheriting hysteresis (discriminated results) of the two immediately preceding states on the basis of the judged results SEL0 through SEL3 coming from the corresponding metric computing circuits 42A through 42F; and those for inheriting only one item of hysteresis (discriminated result).

FIG. 15 shows the latter type of path memories having only one item of hysteresis (discriminated result) to inherit, i.e., path memories 43C and 43D for the third and the fourth state (S100 and S011). The third path memory 43C inherits the hysteresis of the second state (S110) in accordance with the state transitions explained with reference to FIG. 12. The third path memory 43C outputs the retained hysteresis to the path memories 43E and 43F of the corresponding states (S001 and S000). In the third path memory 43C, fixed data of value 0 corresponding to the state transition are inputted to a first-stage latch (D) 51A.

The path memory 43D for the fourth state (S011) is structurally identical to the third path memory 43C except that the fifth state (S001) is inherited instead of hysteresis of the second state (S100), that fixed data of value 1 are inputted to the first-stage latch (D) 51A instead of the fixed data of value 0, and that hysteresis is outputted to the path memories 43A and 43B for the states (S111) and (S110) instead of to the path memories 43E and 43F for the states (S001) and (S000). Thus the third path memory 43C alone is described here, and description of the fourth path memory 43D is omitted.

The path memory 43C is composed of a predetermined number of latches 51A through 51N in stages (i.e., the number of stages should be at least large enough for paths to merge; the stage count generally corresponds to 16 to 32 bits). In keeping with a clock signal CK, the fixed data of value 1 and the hysteresis held in the second path memory 43B are latched successively. A binary decoded output D1 is outputted from the last-stage latch 51N.

Of the remaining path memories 43A, 43B, 43E and 43F, the first path memory 43A (FIG. 16) has the same number of serially connected latches 51A through 51N as the path memory 43C. Between the latches 51A through 51N are interposed selectors 52A through 52M for selectively outputting the hysteresis of the fourth path memory 43D or the hysteresis of each immediately preceding latch.

The selectors 52A through 52M are switched in operation in accordance with the judged result SEL3. In the corresponding metric computing circuit 42A, the hysteresis of the path memory 43D is outputted selectively when the metric from the fourth state (S011) is selected; the self-retained hysteresis is outputted selectively when the metric from the first state (S111) is selected. The first-stage latch 51A latches the fixed data of value 1 corresponding commonly to the two transitions. The last-stage latch 51N outputs the binary decoded output D1.

In the constitution of FIG. 16, the path memory 43F for the sixth state (S000) is structurally identical to the first path memory 43A except that hysteresis of the third path memory 43C is selectively inherited instead of the hysteresis of the fourth path memory 43D, that in keeping with the inheriting of the hysteresis, the fixed data of value 0 are latched by the first-stage latch 51A instead of the fixed data of value 1, that the hysteresis is outputted to a different destination and that signals for switching the selectors 52A through 52M are different. Thus in FIG. 16, the corresponding parts are indicated as such in parentheses, and repetitive descriptions are omitted.

The second path memory 43B (FIG. 17) is composed of the latches 51A through 51N and selectors 52A through 52M. The latches 51A through 51N have the same stage numbers as the path memory 43C. The selectors 52A through 52M selectively output the hysteresis of the first path memory 43A or the hysteresis of the fourth path memory 43D to the latches 51B through 51N except for the first-stage latch 51A.

The selectors 52A through 52M are switched in operation in accordance with the judged result SEL2. In the corresponding metric computing circuit 42B, the hysteresis of the path memory 43A is outputted selectively when the metric from the first state (S111) is selected; the hysteresis of the path memory 43D is outputted selectively when the metric from the fourth state (S011) is selected. The first-stage latch 51A latches the fixed data of value 0 corresponding commonly to the two transitions. The last-stage latch 51N outputs the binary decoded output D1.

In the constitution of FIG. 17, the path memory 43E for the fifth state (S001) is structurally identical to the second path memory 43B except that the hysteresis of the sixth or the third path memory 43F or 43C is selectively inherited instead of the hysteresis of the first or the fourth path memory 43A or 43D, that in keeping with the inheriting of the hysteresis, the fixed data of value 1 are latched by the first-stage latch 51A instead of the fixed data of value 0, that the hysteresis is outputted to a different destination and that signals for switching the selectors 52A through 52M are different. Thus in FIG. 17, the corresponding parts are indicated as such in parentheses, and repetitive descriptions are omitted.

In the path memories 43A through 43F of the constitutions described above, when hysteresis is inherited through a certain number of stages, then the same hysteresis is retained in the corresponding latches. In the Viterbi decoder 40, the binary decoded output D1 is selectively outputted from the last-stage latch 51N in one of the path memories 43A through 43F.

Where a metric is computed for each state in the execution of Viterbi decoding, the branch metrics are calculated by adding up in a weighted manner the equalized signal SPR1 having integrating system characteristics and the equalized signal SPR4 having differential system characteristics in the constitution of FIG. 10. Therefore, this arrangement provides the same effects as the first embodiment.

(4) Fourth Embodiment

In the discriminated results decoded as described above, amplitude fluctuations in the digital reproduced signal DRF cause discrimination accuracy to deteriorate. Therefore in this embodiment, the EPR4 equalized signal SPR4 and the PR1 equalized signal SPR1 are added up in the constitution as shown in FIG. 1 in timed relation such that equalizing reference values are not affected by amplitude fluctuations.

In this embodiment, the state detecting circuit 5 having the constitution as shown in FIG. 1 changes the weighting factor "q" in accordance with the amplitude reference value. Specifically, the weighting factor "q" is set to a significant value when the amplitude reference value becomes 0; when the amplitude reference value is other than 0, the weighting factor "q" is set to 0.

Thus, in this embodiment, the metrics are computed by using the following expressions:

$$LA(n+1)=\min\{LA(n)+Maa(i)+Maa(i+1)+Maa(i+2)+q*Ma'(i),\\ LB(n)+Mba(i)+Mba(i+1)+Mba(i+2)+q*Mb'(i+1)\} \quad (12\text{-}1)$$

$$LB(n+1)=\min\{LA(n)+Mab(i)+Mab(i+1)+Mab(i+2)+q*Ma'(i),\\ LB(n)+Mbb(i)+Mbb(i+1)+Mbb(i+2)+q*Mb'(i+1)\} \quad (12\text{-}2)$$

It may be assumed that for purpose of illustration in relation with a change of the weighting factor "q", the factor "q" is a very large number. On that assumption, the metrics are compared by use of the following expressions:

$$LA(n+1)=\min\{LA(n)+Ma'(i), LB(n)+Mb'(i+1)\} \quad (13\text{-}1)$$

$$LB(n+1)=\min\{LA(n)+Ma'(i), LB(n)+Mb'(i+1)\} \quad (13\text{-}2)$$

In the case above, when the digital reproduced signal DRF contains no noise, one of the branch metrics Ma'(i) and Mb'(i+1) becomes 0. With the amplitude reference value being 0, selectively weighted additions prove to be unaffected by amplitude fluctuations.

When the amplitude reference value is set to a predetermined value, the fourth embodiment adds branch metrics obtained from the equalized signal SPR1 of an integrating system, to branch metrics acquired from the equalized signal SPR4 of a differential system in a selectively weighted manner. This makes it possible for the fourth embodiment to supplement the effects of the first embodiment with an appreciable reduction of the deterioration in the discrimination accuracy caused by amplitude fluctuations.

(5) Fifth Embodiment

In this embodiment, the constitution of FIG. 1 is so arranged illustratively as to execute envelope detection in order to detect amplitude fluctuations in signal level of the reproduced signal. The weighting factor "q" is changed adaptively so that effects of the amplitude fluctuations are offset.

In other words, an disadvantage of the fourth embodiment is that although resistant to effects of amplitude fluctuations, the embodiment tends to enlarge the weighting factor "q" and have low frequency noise components emphasized. Excessively emphasized low frequencies cause the influence by low frequency noise such as cross talk.

This embodiment is designed to circumvent noise-induced deterioration of discrimination accuracy more effectively by adaptively changing the weighting factor "q" in keeping with the amplitude fluctuations of the reproduced signal.

With the fifth embodiment, signal level amplitude fluctuations are first detected from the reproduced signal. The result of the detection is used as a basis for adaptively altering the weighting factor "q". This provides a further improvement of discrimination accuracy.

(6) Other Embodiments

Although the above-described embodiments have been shown relating to the cases computing branch metrics by squaring signal level differences with respect to amplitude reference values, this is not limitative of the invention. Alternatively, the invention may also be applied to a case where metrics are computed by simply using signal level differences.

The above embodiments have been shown boosting margins of provisional discrimination by subjecting the RLL (1, 7) code to PR (1, 1) equalization under the d=1 restriction so that the amplitude reference values take 0, 1 and 2. Alternatively, if margins of provisional discrimination are to be increased by use of various equalizing methods or if the transmission system in use has specific characteristics, the equalizing process may be omitted in carrying out the provisional discrimination.

The embodiments above have been also shown preventing paths from converging following a converging point corresponding to an edge by applying the RLL (1, 7) code under the d=1 restriction, whereby the state transitions taken by the equalized signal SPR4 are limited. However, this is not limitative of the invention. Alternatively, the invention may be applied widely to various coding systems. Where paths are limited for purpose of decoding on the basis of provisionally discriminated results, as in the case of the first embodiment, it is necessary to adopt a coding system with a minimum wavelength of 2T or more with respect to a reference cycle T as is the case with EFM (eight to fourteen modulation).

In connection with the first embodiment and elsewhere, path memories have been shown a case where a path memory is composed of two shift register s corresponding to a leading and a trailing edges in successively latching the provisionally discriminated signal S2. Alternatively, in the invention, the path memory may be constituted by shift registers corresponding to four paths judged by the branch metric processing circuit 10, the shift registers successively transferring fixed-value data instead of the provisionally discriminated signal S2.

Although the above embodiments have been shown adopting EPR4 for differential system equalization and PR1 for integrating system equalization, this is not limitative of the invention. Alternatively, the invention may be applied extensively in cases where the reproduced signal is discriminated through diverse kinds of equalization, such as by use of EEPR (Extended Extended Partial Response) 4 for differential system equalization.

The first embodiment has been shown discriminating provisionally the equalized signal PR1 of an integrating system so as to reduce the number of paths subject to computations. However, this is not limitative of the invention. Alternatively, the number of paths subject to computations may be reduced by provisionally discriminating an added equalized signal that is obtained as needed by adding up equalized signals of differential systems or equalized signals of a differential and an integrating system in a weighted manner.

Although the above embodiments have been described in connection with the decoding of magnetically recorded signals from a video tape recorder to which the invention is applied, this is not limitative of the invention. Alternatively, the invention may also be applied to optically recorded signals from optical disk drives and other diverse data communication setups.

As described, according to the invention, the inventive apparatus adds up equalized signals of an integrating and a differential systems in a weighted manner, or adds up the metrics with respect to amplitude reference values computed from equalized signals of an integrating and a differential systems, in a weighted manner every corresponding paths. This flattens noise characteristics at points of discrimination, whereby noise-induced deterioration of discrimination accuracy is effectively averted.

INDUSTRIAL APPLICABILITY

Since the invention as embodied above is capable of circumventing the noise-induced deterioration in discrimination accuracy, the invention may be adapted advantageously to a digital signal reproducing apparatus having a Viterbi decoder such as a video tape recorder, an optical disk drive.

What is claimed is:

1. A digital signal reproducing apparatus comprising:
differential system equalizing means for outputting an equalized signal of a differential system by equalizing an input signal with respect to an equalizing reference of said differential system;
integrating system equalizing means for outputting an equalized signal of an integrating system by equalizing said input signal with respect to an equalizing reference of said integrating system;
adding means for adding the equalized signals of said differential system and said integrating system in a weighted manner to output an added equalized signal; and
maximum likelihood decoding means for subjecting said added equalized signal to maximum likelihood decoding in order to output a discriminated binary result corresponding to said input signal.

2. A digital signal reproducing apparatus according to claim 1, wherein said maximum likelihood decoding means includes:
provisional discriminating means for provisionally discriminating one signal out of said added equalized signal and the equalized signals of said integrating system and said differential system in a predetermined sampling cycle so as to output a binary signal having a variable point, said variable point being either the same as or delayed by one clock cycle relative to a correctly discriminated result; and
judging means for limiting, based on said binary signal, transitions of possible states which may be taken by said added equalized signal, and for detecting the most likelihood state of the transitions thus limited, thereby outputting said discriminated binary result.

3. A digital signal reproducing apparatus comprising:
differential system equalizing means for outputting an equalized signal of a differential system by equalizing an input signal with respect to an equalizing reference of said differential system;
integrating system equalizing means for outputting an equalized signal of an integrating system by equalizing said input signal with respect to an equalizing reference of said integrating system;
differential system metric calculating means for calculating metric between said differential system equalized signal and a differential system amplitude reference value, said differential system amplitude reference value being taken by said differential system equalized signal, in a transition taken by said differential system equalized signal;
integrating system metric calculating means for calculating metric between said integrating system equalized signal and integrating system amplitude reference value, said integrating system amplitude reference value being taken by said integrating system equalized signal, in a transition taken by said integrating system equalized signal;
adding means for performing an adding process of the metrics of said differential and said integrating system for each of the transitions corresponding thereto using a predetermined weighting factor in order to output an overall metric of each transition;
accumulative adding means for accumulating the overall metrics to detect likelihood of each transition; and
judging means for judging the most likelihood of the one of each of said transitions and for outputting an accordingly discriminated binary value corresponding to said input signal.

4. A digital signal reproducing apparatus according to claim 3, wherein said differential system metric calculating means discriminates provisionally the equalized signals of said integrating system and said differential system in a predetermined sampling cycle so as to output a binary signal having a variable point, said variable point being either the same as or delayed by one clock cycle relative to a correctly discriminated result; and wherein said differential system metric calculating means limits, based on said binary signal, transitions of the states taken by said differential system equalized signal, in order to calculate the metric for said differential system.

5. A digital signal reproducing apparatus according to claim 3, wherein, when the transition of said integrating system reaches a predetermined equalizing reference value, said adding means replaces the weighted addition with a process in which the metric of said integrating system corresponding to said transition of equalizing reference value is added selectively in a predetermined ratio to the metric of the corresponding differential system.

6. A digital signal reproducing apparatus according to claim 4, wherein, when the transition of said integrating system reaches a predetermined equalizing reference value, said adding means replaces the weighted addition with a process in which the metric of said integrating system corresponding to said transition of equalizing reference value is added selectively in a predetermined ratio to the metric of the corresponding differential system.

7. A digital signal reproducing apparatus according to claim 3, further comprising level fluctuation detecting means for outputting a detected result of level fluctuations of said input signal, wherein said adding means varies said weighting factor in accordance with said detected result of level fluctuations.

8. A digital signal reproducing apparatus according to claim 4, further comprising level fluctuation detecting means for outputting a detected result of level fluctuations of said input signal, wherein said adding means varies said weighting factor in accordance with said detected result of level fluctuations.

9. A digital signal reproducing apparatus according to claim 5, further comprising level fluctuation detecting means for outputting a detected result of level fluctuations of said input signal, wherein said adding means varies said weighting factor in accordance with said detected result of level fluctuations.

10. A digital signal reproducing apparatus according to claim 6, further comprising level fluctuation detecting means for outputting a detected result of level fluctuations of said input signal, wherein said adding means varies said weighting factor in accordance with said detected result of level fluctuations.

* * * * *